US012558864B2

(12) United States Patent
Hokari et al.

(10) Patent No.: US 12,558,864 B2
(45) Date of Patent: Feb. 24, 2026

(54) GLASS ARTICLE AND DISPLAY DEVICE

(71) Applicant: AGC Inc., Tokyo (JP)

(72) Inventors: Ryou Hokari, Tokyo (JP); Atsushi Inoue, Tokyo (JP); Toshinari Watanabe, Tokyo (JP); Yasuhiro Inoue, Tokyo (JP)

(73) Assignee: AGC Inc., Tokyo (JP)

( * ) Notice: Subject to any disclaimer, the term of this patent is extended or adjusted under 35 U.S.C. 154(b) by 0 days.

(21) Appl. No.: 18/949,372

(22) Filed: Nov. 15, 2024

(65) Prior Publication Data

US 2025/0065592 A1 Feb. 27, 2025

Related U.S. Application Data

(63) Continuation of application No. PCT/JP2023/018004, filed on May 12, 2023.

(30) Foreign Application Priority Data

May 16, 2022 (JP) ................................. 2022-080347

(51) Int. Cl.
| | |
|---|---|
| *B32B 3/10* | (2006.01) |
| *B32B 3/02* | (2006.01) |
| *B32B 17/06* | (2006.01) |
| *B32B 17/10* | (2006.01) |
| *B60K 35/22* | (2024.01) |
| *B60K 35/50* | (2024.01) |
| *B60K 35/60* | (2024.01) |
| *B60K 35/81* | (2024.01) |
| *B60K 37/00* | (2006.01) |

(Continued)

(52) U.S. Cl.
CPC .............. *B32B 3/02* (2013.01); *B32B 17/061* (2013.01); *B32B 17/10* (2013.01); *B60K 35/22* (2024.01); *B60K 35/50* (2024.01); *B60K 35/60* (2024.01); *B60K 35/81* (2024.01); *B60K 37/00* (2013.01); *C03C 21/002* (2013.01); *H05K 5/03* (2013.01); *B32B 2307/4023* (2013.01); *B32B 2307/54* (2013.01); *B32B 2307/7376* (2023.05); *B32B 2457/20* (2013.01); *B32B 2605/003* (2013.01); *B60K 35/26* (2024.01)

(58) Field of Classification Search
None
See application file for complete search history.

(56) References Cited

FOREIGN PATENT DOCUMENTS

| | | | | |
|---|---|---|---|---|
| JP | WO2018025779 A1 * | 6/2019 | ....... | B32B 17/10155 |
| KR | 102760372 B1 * | 1/2025 | ............. | C03C 17/28 |

(Continued)

*Primary Examiner* — Christopher M Polley
(74) *Attorney, Agent, or Firm* — Oblon, McClelland, Maier & Neustadt, L.L.P.

(57) ABSTRACT

The present invention relates to a glass article 2 including a first main surface 2A, a second main surface 2B, and an end surface 2C connecting the first main surface 2A and the second main surface 2B, in which the end surface 2C includes a side surface portion 2CC, a first chamfered portion 2CA connecting the side surface portion 2CC and the first main surface 2A, and a second chamfered portion 2CB connecting the side surface portion 2CC and the second main surface 2B, and a parameter R defined by Formula (1) satisfies Formula (2) (in expression (1), $E_{cg}$, A, B, C, D, and t, are as defined in the specification).

$$R = 0.38 \cdot E_{cg} - A/t - 2.61 \cdot B/t + 4.38 \cdot C/t - 10.6 \cdot D/t \quad (1):$$

$$R \leq 23.58 \quad (2):$$

20 Claims, 12 Drawing Sheets

(51) Int. Cl.
    *C03C 21/00*         (2006.01)
    *H05K 5/03*         (2006.01)
    *B60K 35/26*         (2024.01)

(56)           References Cited

FOREIGN PATENT DOCUMENTS

| WO | WO 2016/027812 A1 | | 2/2016 | | |
|----|-------------------|---|--------|---|--------------|
| WO | WO-2016186936 A1 | * | 11/2016 | ........... | H10H 29/142 |
| WO | WO-2021006116 A1 | * | 1/2021 | ............... | B24B 9/10 |

* cited by examiner

⊗Z1 →X1 ↑Y1

⊙Z2 ←X2 ↓Y2

GLASS ARTICLE AND DISPLAY DEVICE

CROSS-REFERENCE TO RELATED APPLICATIONS

This is a continuation of International Application No. PCT/JP2023/018004 filed on May 12, 2023, and claims priority from Japanese Patent Application No. 2022-080347 filed on May 16, 2022, the entire content of which is incorporated herein by reference.

TECHNICAL FIELD

The present invention relates to a glass article and a display device.

BACKGROUND ART

A liquid crystal display or an organic EL display may be used in an in-vehicle display device or the like that displays information necessary for driving or the like. In such a display device, a glass cover member may be disposed to protect a front surface. For example, Patent Literature 1 discloses an in-vehicle display device capable of improving the impact resistance of the cover member.

CITATION LIST

Patent Literature

Patent Literature 1: WO2016/027812

SUMMARY OF INVENTION

Technical Problem

In particular, in an in-vehicle display device or the like, it is required to have excellent impact resistance so that end portions of a cover member do not break even if the end portions are hit by a head of an occupant when a collision accident of a vehicle occurs.

The present invention has been made in view of the above problems, and an object thereof is to provide a glass article and a display device capable of reducing cracks at end portions.

Solution to Problem

The glass article according to the present disclosure is a glass article including a first main surface, a second main surface, and an end surface connecting the first main surface and the second main surface, in which the end surface includes a side surface portion, a first chamfered portion connecting the side surface portion and the first main surface, and a second chamfered portion connecting the side surface portion and the second main surface, and a parameter R defined by Formula (1) satisfies Formula (2).

$$R = 0.38 \cdot E_{cg} - A/t - 2.61 \cdot B/t + 4.38 \cdot C/t - 10.6 \cdot D/t \quad (1)$$

$$R \le 23.58 \quad (2)$$

In Formula (1), $E_{cg}$ is the Young's modulus (GPa) of the glass article, A is a width (mm) of the first chamfered portion, B is a width (mm) of the second chamfered portion, C is a thickness (mm) of the side surface portion, D is a thickness (mm) of the first chamfered portion, and t is a thickness (mm) of the glass article.

The display device according to the present disclosure is an in-vehicle display device in which the glass article, a display panel, and a bottom member configured to be fixed to a vehicle are stacked, and the glass article has the second main surface positioned to face the display panel.

Advantageous Effects of Invention

According to the present invention, cracks at end portions can be reduced.

DESCRIPTION OF EMBODIMENTS

Preferred embodiments of the present invention will be described below in detail with reference to the accompanying drawings. The present invention is not limited to these embodiments and also includes a combination of the embodiments in the case where there are a plurality of embodiments. In addition, numerical values include rounding ranges.

1. Configuration of Display Device

Figure 1:
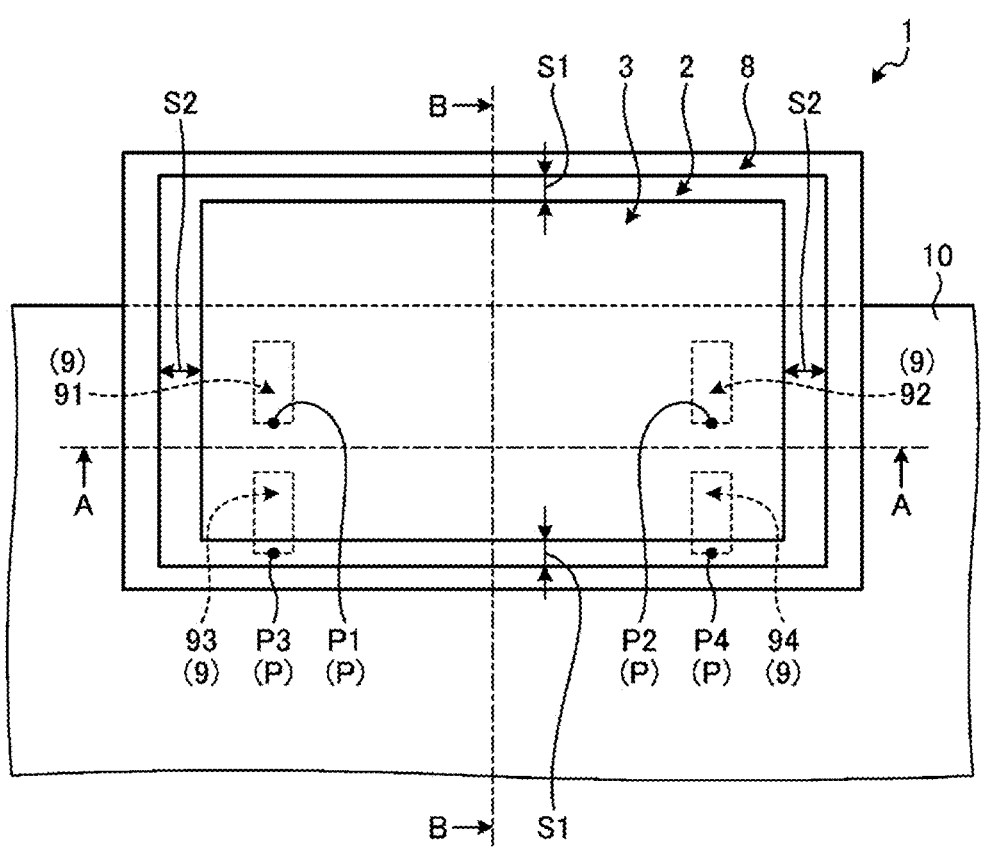
FIG. 1 is a schematic diagram illustrating a display device according to the present embodiment.
Figure 2:
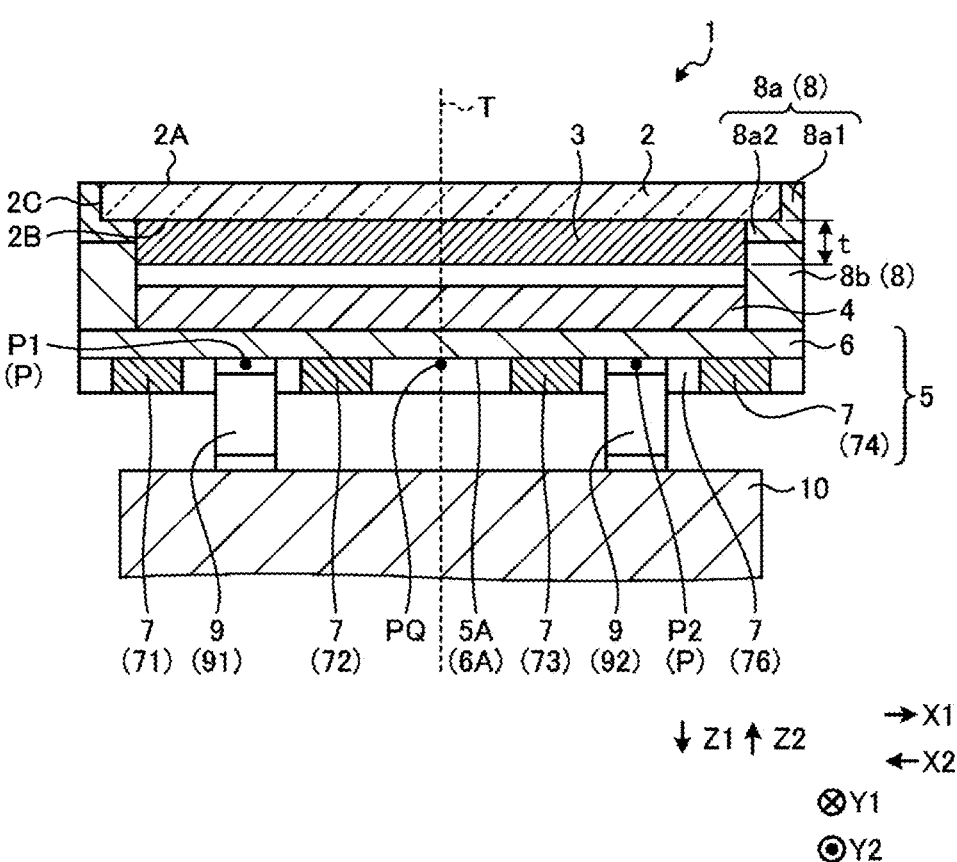
FIG. 2 is a cross-sectional view taken along line A-A in FIG. 1.
Figure 3:
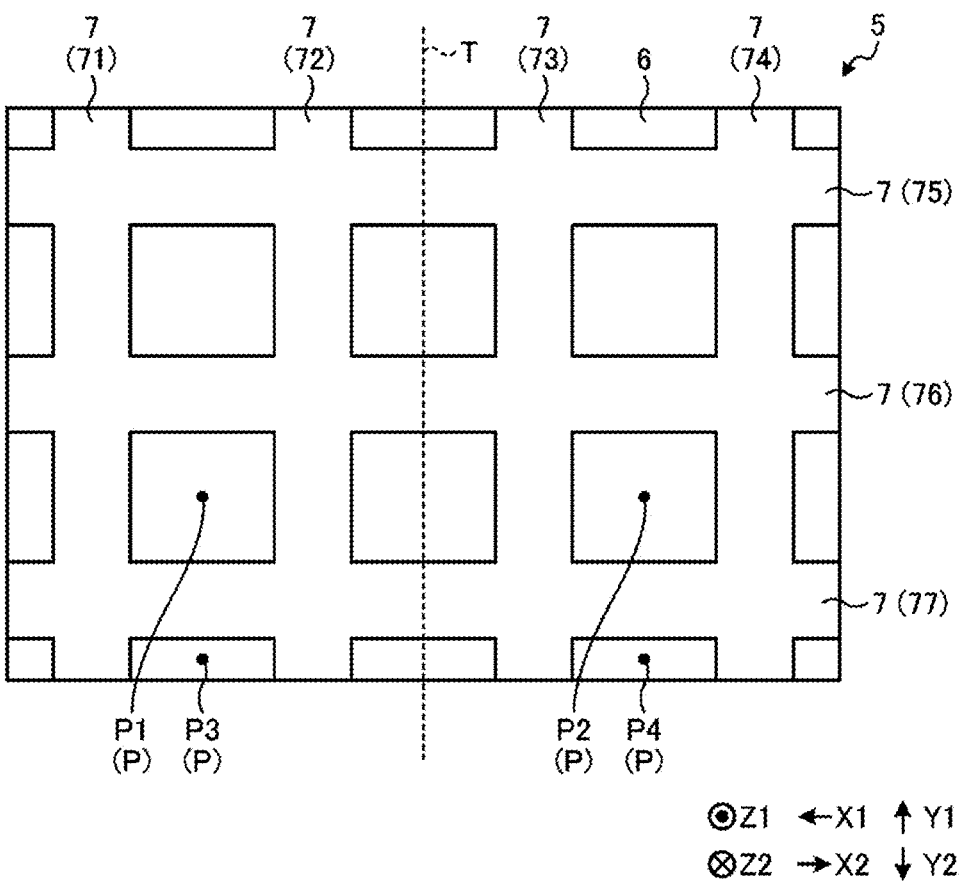
FIG. 3 is a schematic diagram of a bottom member.
Figure 4:
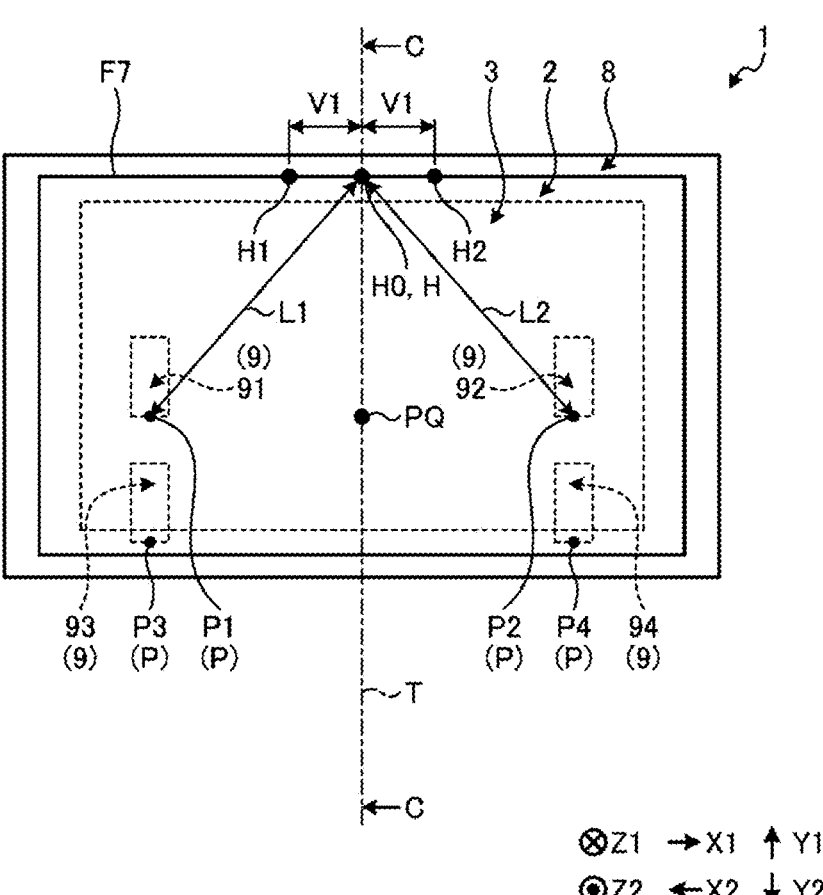
FIG. 4 is a schematic diagram of the display device viewed from a display surface side.
Figure 5:
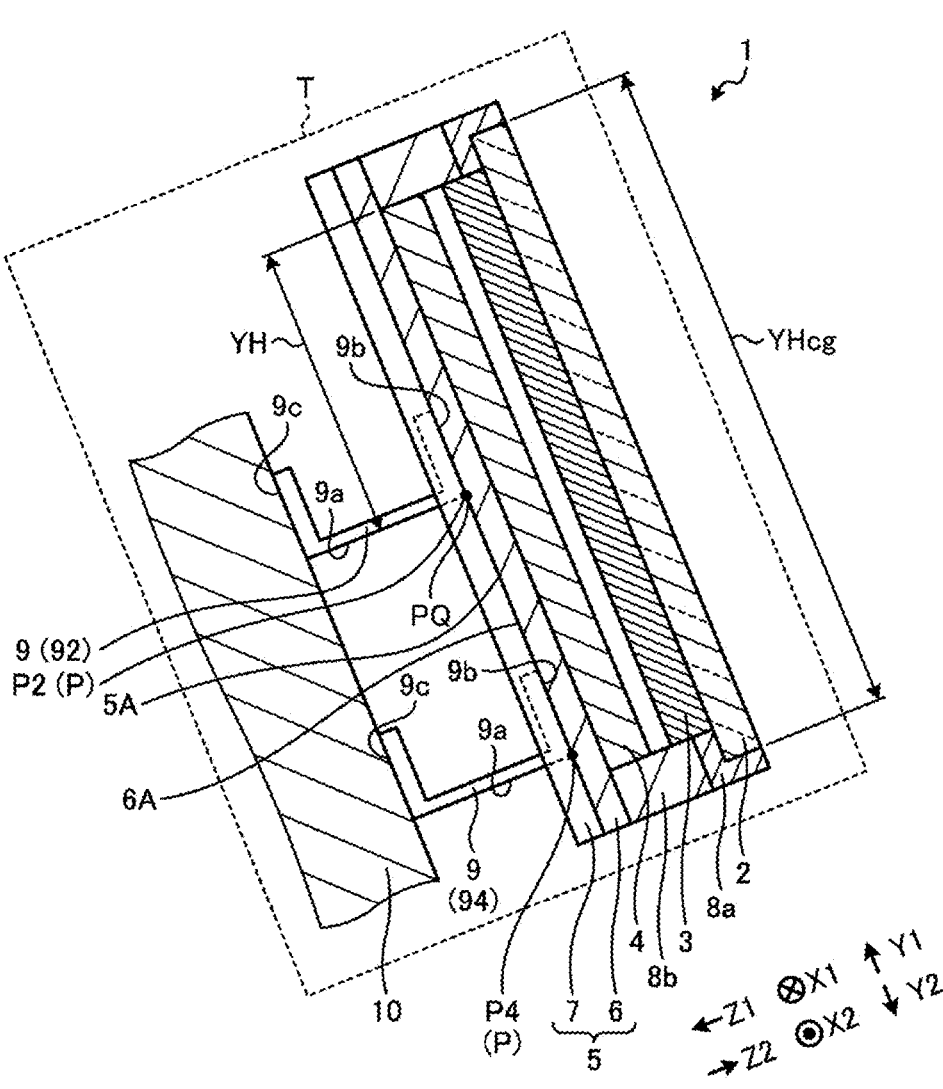
FIG. 5 is a cross-sectional view taken along line B-B in FIG. 1.
Figure 6:
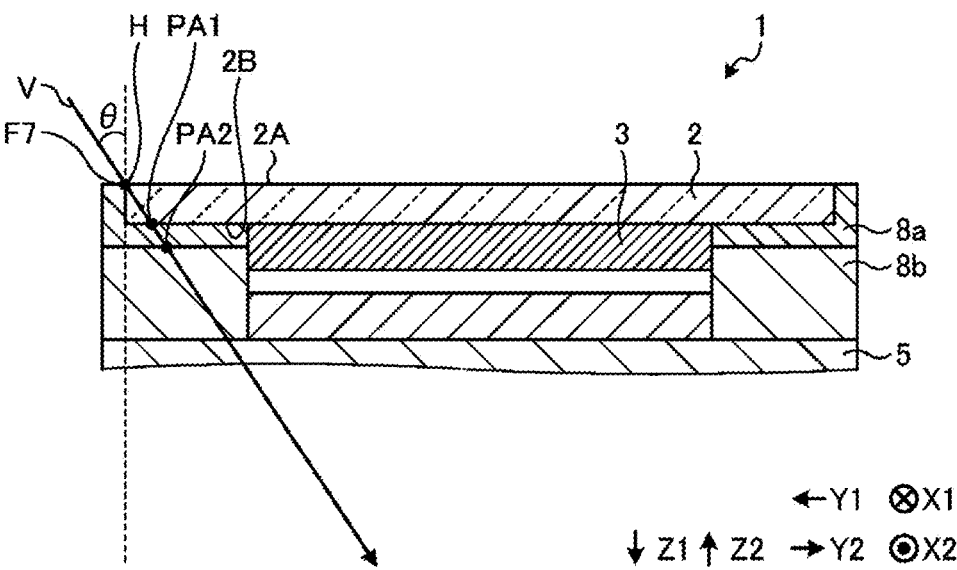
FIG. 6 is a cross-sectional view taken along line C-C in FIG. 4.

FIG. 1 is a schematic diagram illustrating a display device according to the present embodiment. FIG. 2 is a cross-sectional view taken along line A-A in FIG. 1. FIG. 3 is a schematic diagram of a bottom member. FIG. 4 is a schematic diagram of the display device viewed from a display surface side. FIG. 5 is a cross-sectional view taken along line B-B in FIG. 1. FIG. 6 is a cross-sectional view taken along line C-C in FIG. 4.

As illustrated in FIG. 1, a display device 1 according to the present embodiment is an in-vehicle display device provided in a vehicle. The display device 1 is, for example, a car navigation device. The display device 1 can be used for any purpose and may be another display device such as a display audio device mounted on a vehicle. As will be described in detail later, the display device 1 is fixed to an interior portion 10 of a vehicle via fixing points P formed on a back surface opposite to a display surface. The interior portion 10 is a member provided inside the vehicle, and is, for example, a part of a dashboard of the vehicle.

Hereinafter, a thickness direction of the display device 1 is defined as a Z direction, and in a state where the display device 1 is attached to the vehicle, a direction (left-right direction in the example of FIG. 1) orthogonal to the Z direction and along a horizontal surface is defined as an X direction, and a direction (up-down direction in the example of FIG. 1) orthogonal to the Z direction and the X direction is defined as a Y direction. In addition, one direction along the X direction (right direction in the example of FIG. 1) is defined as a direction X1, and the other direction along the X direction (left direction in the example of FIG. 1) is defined as a direction X2. One direction along the Y direction (vertically upward direction) is defined as a direction Y1, and the other direction along the Y direction (vertically downward direction) is defined as a direction Y2. One direction along the Z direction (direction from display surface of display device 1 toward back surface) is defined as a direction Z1 (first direction), and the other direction along the Z direction (direction from back surface of display device 1 toward display surface) is defined as a direction Z2. In the present embodiment, an end portion of the display device 1 on the direction Y1 side is an end portion positioned vertically upward (upper end portion).

As illustrated in FIG. 2, the display device 1 includes a glass article 2, a display panel 3, a backlight unit 4, a bottom member 5, and a sidewall member 8. In the display device 1, the glass article 2, the display panel 3, the backlight unit 4, and the bottom member 5 are disposed (overlapped) in this order in the direction Z1, and the sidewall member 8 having a frame shape is disposed around the glass article 2, the display panel 3, and the backlight unit 4. That is, the bottom member 5 and the sidewall member 8 constitute a housing that houses the glass article 2 and the display panel 3, the bottom member 5 covers back surfaces (surfaces opposite to surfaces on a display side) of the glass article 2 and the display panel 3, and the sidewall member 8 covers side surfaces of the glass article 2 and the display panel 3.

2. Glass Article

The glass article 2 is a transparent plate-shaped member that transmits visible light. The glass article 2 has a first main surface 2A which is a main surface on the direction Z2 side (display surface side), a second main surface 2B which is a main surface on the direction Z1 side (back surface side), and an end surface 2C connecting the first main surface 2A and the second main surface 2B. The end surface 2C is also referred to as a side surface of the glass article 2. In the glass article 2, it is preferable that the second main surface 2B is a surface on the display panel 3 side and the first main surface 2A is a surface opposite to the display panel 3 and exposed to the outside. The glass article 2 preferably has a printed layer on the second main surface 2B side (on the second main surface 2B). The printed layer is a layer that blocks light from passing through the glass article 2 (for example, a black layer that does not transmit visible light), and can also be said to be a layer that has a lower transmittance to visible light than the glass article 2. The printed layer is preferably provided so as to surround a region of the second main surface 2B that overlaps the display panel 3 when viewed from the Z direction. Further, a functional layer such as an antiglare layer, an antireflection layer, or an antifouling layer may be provided on the first main surface 2A side of the glass article 2.

A thickness t of the glass article 2 is preferably 0.5 mm or more, more preferably 0.7 mm or more, and still more preferably 1.1 mm or more. The thickness t of the glass article 2 is preferably 2.5 mm or less, more preferably 2.0 mm or less, and still more preferably 1.3 mm or less. That is, the thickness t is preferably 0.5 mm or more and 2.5 mm or less, more preferably 0.7 mm or more and 2.0 mm or less, and still more preferably 1.1 mm or more and 1.3 mm or less. The thickness t is a length from the first main surface 2A to the second main surface 2B in the Z direction.

In the example of the present embodiment, the glass article 2 has a flat plate shape that is rectangular when viewed from the Z direction. As for a size of the glass article 2, for example, in the case where the glass article 2 is rectangular, a length in a longer side direction (X direction in the example of the present embodiment) may be 100 mm or more and 800 mm or less, and a length in a shorter side direction (Y direction in the example of the present embodiment) may be 40 mm or more and 300 mm or less. However, the glass article 2 is not limited to a flat plate shape that is rectangular when viewed from the Z direction, and may have any shape. The glass article 2 may have, for example, an elliptical shape when viewed from the Z direction, or may have, for example, a curved shape. The glass article 2 may have any size. In addition, in the case where the glass article 2 has a curved shape, a thickness direction of the glass article 2 at a center position of the main surface of the glass article 2 may be defined as the Z direction.

Here, the Young's modulus ($E_{cg}$) of the glass article 2 is preferably 60 GPa or more, and more preferably 70 GPa or more. The Young's modulus ($E_{cg}$) of the glass article 2 is preferably 90 GPa or less, more preferably 80 GPa or less, and still more preferably 75 GPa or less. That is, the Young's modulus of the glass article 2 is preferably 60 GPa or more and 90 GPa or less, more preferably 70 GPa or more and 80 GPa or less, and still more preferably 70 GPa or more and 75 GPa or less. The Young's modulus of the members including the glass article 2 may be obtained by a tensile test (JIS K7161-1, 2:2014, JIS K7113: 1995).

The glass article 2 is made of glass. The glass article 2 is preferably made of a strengthened glass, and the strengthened glass is preferably a chemically strengthened glass.

In the case where the glass article 2 is made of a chemically strengthened glass, a thickness (DOL) of a compressive stress layer of the glass article 2 is preferably 10 μm or more, more preferably 15 μm or more, still more preferably 25 μm or more, and even more preferably 30 μm or more, for example. The thickness (DOL) of the compressive stress layer is preferably 180 μm or less, and more preferably 50 μm or less, for example. That is, the thickness (DOL) 30 of the compressive stress layer of the glass article 2 is preferably, for example, 10 μm or more and 180 μm or less.

The surface compressive stress (CS) of the compressive stress layer is preferably 500 MPa or more, more preferably 650 MPa or more, and still more preferably 750 MPa or more. Although an upper limit is not particularly limited, CS is preferably 1200 MPa or less, for example. That is, CS is preferably, for example, 500 MPa or more and 1200 MPa or less.

Examples of a method for subjecting glass to a chemical strengthening treatment to obtain a chemically strengthened glass include, typically, a method of immersing glass in a $KNO_3$ molten salt to conduct an ion exchange treatment, followed by cooling the glass to around room temperature. Treatment conditions such as a temperature of the $KNO_3$ molten salt and an immersion time may be set such that the surface compressive stress and the thickness of the compressive stress layer have desired values.

Examples of a glass type include a soda lime glass and an aluminosilicate glass ($SiO_2$—$Al_2O_3$—$Na_2O$-based glass). Among them, the aluminosilicate glass is preferred from the viewpoint of strength.

Examples of a glass material include a glass material containing, in terms of mol % based on oxides, 50% or more and 80% or less of $SiO_2$, 1% or more and 20% or less of $Al_2O_3$, 6% or more and 20% or less of $Na_2O$, 0% or more and 11% or less of $K_2O$, 0% or more and 15% or less of MgO, 0% or more and 6% or less of CaO, and 0% or more and 5% or less of $ZrO_2$.

A glass for chemical strengthening, which is based on an aluminosilicate glass, (for example, "Dragontrail (registered trademark)" manufactured by AGC Inc.) can also be suitably used.

The glass article 2 mounted on the display device 1 is required reduce cracks at end portions. In particular, the end portions of the glass article 2 are required to have excellent impact resistance (hereinafter, referred to as "end portion impact resistance"), as evaluated in a head impact test, so that the end portions do not break even if the end portions are hit by a head or the like of an occupant when a collision accident of a vehicle occurs, for example. Hereinafter, a configuration for improving the end portion impact resistance of the glass article 2 and reducing cracks at the end portions will be described. In the present embodiment, although the glass article 2 is mounted on the in-vehicle display device 1 described above and used as a cover member of the display device 1, the glass article 2 is not limited thereto and may be used for any purpose.

Figure 7A:
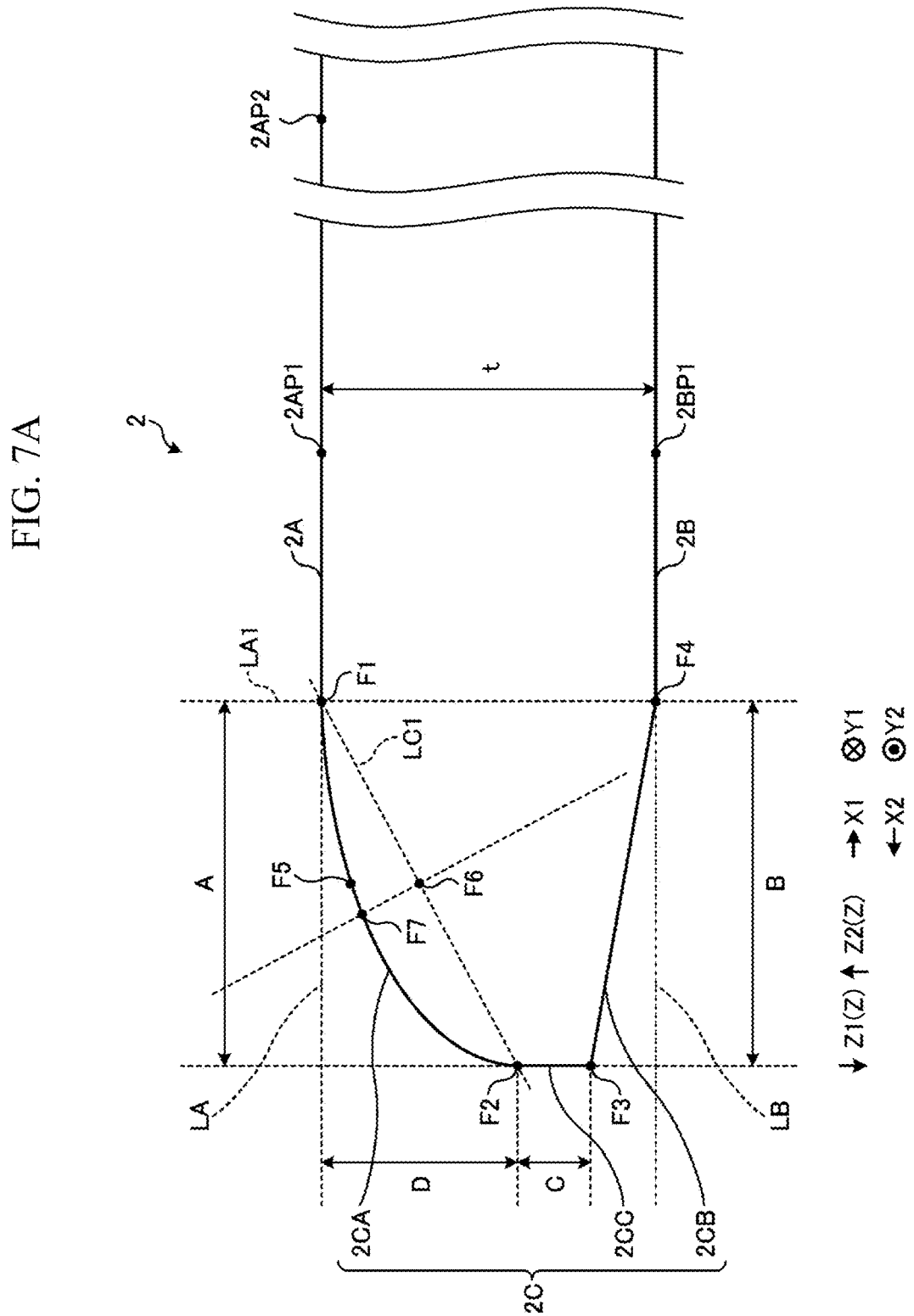
FIG. 7A is a schematic partially enlarged cross-sectional view of a glass article.

FIG. 7A is a schematic partially enlarged cross-sectional view of a glass article. As illustrated in FIG. 7A, the end surface 2C of the glass article 2 includes a first chamfered portion 2CA, a second chamfered portion 2CB, and a side surface portion 2CC. The side surface portion 2CC corresponds to a non-chamfered portion of the end surface 2C, and the first chamfered portion 2CA and the second chamfered portion 2CB correspond to chamfered portions of the end surface 2C. The end surface 2C may have a shape including the first chamfered portion 2CA, the second chamfered portion 2CB, and the side surface portion 2CC over an entire circumference of the glass article 2 as illustrated in FIG. 7A, when a central axis of the glass article 2 along the Z direction is set as an axial direction, or may have such a shape in a part of the circumference.

In the example of FIG. 7A, although the first main surface 2A and the second main surface 2B have a flat shape (linear shape) when viewed from a direction orthogonal to the Z direction (Y direction in the example of FIG. 7A), the first main surface 2A and the second main surface 2B are not limited thereto and may have a bent shape (curved shape) when viewed from a direction orthogonal to the Z direction (Y direction in the example of FIG. 7A).

(Side Surface Portion)

The side surface portion 2CC is a surface including a portion of the end surface 2C that protrudes most outward of the glass article 2. In the example of FIG. 7A, although the side surface portion 2CC extends in a direction perpendicular to the first main surface 2A and the second main surface 2B (Z direction in the example of FIG. 7A), the side surface portion 2CC is not limited thereto and may extend in any direction not parallel to the first main surface 2A and the second main surface 2B (direction intersecting X direction and Y direction). In other words, when the glass article 2 is viewed from the direction orthogonal to the Z direction (Y direction in the example of FIG. 7A), a line along the side surface portion 2CC intersects a line along the first main surface 2A and a line along the second main surface 2B. In addition, in the example of FIG. 7A, although the side surface portion 2CC has a flat shape (linear shape) when viewed from the direction orthogonal to the Z direction (Y direction in the example of FIG. 7A), the side surface portion 2CC is not limited thereto and may have a bent shape (curved shape) when viewed from the direction orthogonal to the Z direction (Y direction in the example of FIG. 7A), for example, by chamfering.

(First Chamfered Portion)

The first chamfered portion 2CA connects the first main surface 2A and the side surface portion 2CC. That is, the first chamfered portion 2CA is positioned between the first main surface 2A and the side surface portion 2CC in the thickness direction (Z direction in the example of FIG. 7A), an end portion of the first chamfered portion 2CA on the direction Z2 side is connected to the first main surface 2A, and an end portion of the first chamfered portion 2CA on the direction Z1 side is connected to the side surface portion 2CC. When viewed from a direction orthogonal to the Z direction (Y direction in the example of FIG. 7A), the first chamfered portion 2CA is inclined toward the inside of the glass article 2 (direction X1 in the example of FIG. 7A) as approaching the direction Z2 side.

In the present embodiment, the first chamfered portion 2CA has an R-chamfered shape, in other words, has a bent shape (curved shape) when viewed from the direction orthogonal to the Z direction (Y direction in the example of FIG. 7A). When viewed from the direction orthogonal to the Z direction (Y direction in the example of FIG. 7A), the radius of curvature of the first chamfered portion 2CA is preferably 0.2 mm or more and 20 mm or less, more preferably 2 mm or more and 10 mm or less, and still more preferably 2 mm or more and 7 mm or less. The radius of curvature of the first chamfered portion 2CA is preferably 0.2 mm or more, more preferably 2 mm or more, and is preferably 20 mm or less, more preferably 10 mm or less, and still more preferably 7 mm or less. However, the first chamfered portion 2CA is not limited to the R-chamfered shape. For example, the first chamfered portion 2CA may have a C-chamfered shape, in other words, may have a flat shape (linear shape) when viewed from the direction orthogonal to the Z direction (Y direction in the example of FIG. 7A).

(Second Chamfered Portion)

The second chamfered portion 2CB connects the second main surface 2B and the side surface portion 2CC. That is, the second chamfered portion 2CB is positioned between the second main surface 2B and the side surface portion 2CC in the Z direction, an end portion of the second chamfered portion 2CB on the direction Z1 side is connected to the second main surface 2B, and an end portion of the second chamfered portion 2CB on the direction Z2 side is connected to the side surface portion 2CC. When viewed from the direction orthogonal to the Z direction (Y direction in the example of FIG. 7A), the second chamfered portion 2CB is inclined toward the inside of the glass article 2 (direction X1 in the example of FIG. 7A) as approaching the direction Z1 side.

In the present embodiment, the second chamfered portion 2CB has a C-chamfered shape. However, the second chamfered portion 2CB is not limited to a C-chamfered shape, and may have an R-chamfered shape.

(Boundary Position)

The positions of the first chamfered portion 2CA, the second chamfered portion 2CB and the side surface portion 2CC can be specified by boundary positions F1, F2, F3 and F4. Specifically, in the end surface 2C of the glass article 2, a region from the boundary position F1 to the boundary position F2 in the Z direction is the first chamfered portion 2CA, a region from the boundary position F2 to the boundary position F3 in the Z direction is the side surface portion 2CC, and a region from the boundary position F3 to the boundary position F4 in the Z direction is the second chamfered portion 2CB. That is, the boundary position F1 is a boundary position between the first main surface 2A and the first chamfered portion 2CA, the boundary position F2 is a boundary position between the first chamfered portion 2CA and the side surface portion 2CC, the boundary position F3 is a boundary position between the side surface portion 2CC and the second chamfered portion 2CB, and the boundary position F4 is a boundary position between the second chamfered portion 2CB and the second main surface 2B.

The boundary position F1 can be defined as follows.

When a cross section of the glass article 2 is observed by using a digital microscope (for example, VHK-6000 manufactured by KEYENS) from a direction perpendicular to the thickness direction (Z direction) of the glass article 2, a line along the first main surface 2A is defined as a line LA. The line LA may be a straight line or an arc line passing through three points on the first main surface 2A: a position 2AP1, a position 2AP2, and an arbitrary intermediate point between the position 2AP1 and the position 2AP2. For example, when an arbitrary point on the first chamfered portion 2CA or the side surface portion 2CC of the end surface 2C is defined as a point F5, the position 2AP1 is defined as an intersection point between an arc with a radius of 3 mm centered on the point F5 and the first main surface 2A, and the position 2AP2 is defined as an intersection point of an arc with a radius of 8 mm centered on the point F5 and the first main surface 2A. When the line LA is extended to the outside of the glass article 2 from the position 2AP1, a point on the first main surface 2A at a distance of 50 μm from the extension line of the line LA and closest to the position 2AP1 may be set as the boundary position F1. In other words, the distance between the boundary position F1 and an intersection point between the extension line and a perpendicular line drawn from the boundary position F1 to the extension line of the line LA is 50 μm.

The boundary positions F2 and F3 can be defined as follows.

When the cross section of the glass article 2 is observed by using a digital microscope (for example, VHK-6000 manufactured by KEYENS) from the direction perpendicular to the thickness direction (Z direction) of the glass article 2, a line perpendicular to the line LA passing through the boundary position F1 is defined as a line LA1. A point where a line parallel to the line LA1 and the end surface 2C meet at one point is defined as an outermost position of the end surface 2C (that is, a position of the end surface 2C that protrudes most outwardly from the glass article 2). In this case, an intersection point (intersection point on the direction Z2 side) between the end surface 2C and a line obtained by moving a line parallel to the line LA1 at the outermost position of the end surface 2C by 50 μm in a direction perpendicular to that line may be defined as the boundary position F2. On the other hand, an intersection point (intersection point on the direction Z1 side) between the end surface 2C and the line obtained by moving the line parallel to the line LA1 at the outermost position of the end surface 2C by 50 μm in the direction perpendicular to that line may be defined as the boundary position F3.

The boundary position F4 can be defined as follows.

By using a digital microscope (VHK-6000 manufactured by KEYENS), a line obtained by moving the line LA in a direction parallel to the thickness direction (Z direction) of the glass article 2 and toward the direction Z1 side by the thickness t of the glass article 2 is defined as a line LB. The line LB may be regarded as a line along the second main surface 2B. A line is drawn from the position 2AP1 along the thickness direction (Z direction), and a point where that line intersects the second main surface 2B is defined as a position 2BP1. When the line LB is extended further outside the glass article 2 (in the X direction) than the position 2BP1, a point on the second main surface 2B at a distance of 50 μm from the extension line of the line LB and closest to the position 2BP1 may be defined as the boundary position F4. In other words, the distance between the boundary position F4 and an intersection point between the extension line and a perpendicular line drawn from the boundary position F4 to the extension line of the line LB is 50 μm.

In the example of FIG. 7A, although the boundary positions F1 and F4 in the X direction of the glass article 2 are the same, the positions are not limited thereto, and the boundary positions F1 and F4 may be shifted in the X direction of the glass article 2.

(Parameter R)

The present inventors have found that by designing the glass article 2 such that a parameter R for the shape of the end surface 2C of the glass article 2 falls within a predetermined range, the end portion impact resistance of the glass article 2 can be improved and cracks can be reduced. Specifically, in the case where the parameter R is set to the value shown in the following Formula (1), the glass article 2 of the present embodiment can improve the end portion impact resistance of the glass article 2 and reduce cracks at end portions when the parameter R satisfies the following Formula (2).

$$R = 0.38 \cdot E_{cg} - A/t - 2.61 \cdot B/t + 4.38 \cdot C/t - 10.6 \cdot D/t \qquad (1)$$

$$R \le 23.58 \qquad (2)$$

In Formula (1), $E_{cg}$ indicates the Young's modulus (GPa) of the glass article 2, A is a width (mm) of the first chamfered portion 2CA, and is a distance from the boundary position F1 to the boundary position F2 in a direction along a main surface of the glass article 2 (X direction in the example of FIG. 7A) when the glass article 2 is viewed from the direction perpendicular to the thickness direction (Z direction). In Formula (1), B is a width (mm) of the second chamfered portion 2CB, and is a distance from the boundary position F3 to the boundary position F4 in the direction along the main surface of the glass article 2 when the glass article 2 is viewed from the direction perpendicular to the thickness direction. In Formula (1), C is a thickness (mm) of the side surface portion 2CC, and is a distance from the boundary position F2 to the boundary position F3. In Formula (1), D is a thickness (mm) of the first chamfered portion 2CA, and is a distance from the boundary position F1 to the boundary position F2 in a tangential direction of the outermost position of the end surface 2C when the glass article 2 is viewed from the direction perpendicular to the thickness direction (Z direction). In addition, in Formula (1), t is the thickness (mm) of the glass article 2 as described above.

When the parameter R satisfies Formula (2) described above, the glass article 2 can improve the end portion impact resistance. The parameter R tends to have a lower value as the width A of the first chamfered portion 2CA and the width B of the second chamfered portion 2CB increase. That is, when the width A of the first chamfered portion 2CA is increased, a contact portion of an impactor moves away from the end surface 2C, and the impact of the impactor can be absorbed by the first main surface 2A, thereby improving the impact resistance of the end surface 2C.

When the widths of the first chamfered portion 2CA and the second chamfered portion 2CB are increased, a thickness of the end surface 2C becomes smaller with respect to the thickness t of the glass article 2, thereby reducing the bending stress generated on the end surface 2C and improving the impact resistance of the end surface 2C. The parameter R tends to have a lower value as the thickness D of the first chamfered portion 2CA increases. That is, as the thickness of the end surface 2C becomes smaller with respect to the thickness t of the glass article 2, the bending stress generated on the end surface 2C is reduced, and the impact resistance of the end surface 2C can be improved.

The contribution of the thickness D to the impact resistance is strongly related to the width A. For the same thickness D, the parameter R tends to have a higher value as the thickness C of the side surface portion 2CC decreases. That is, when the thickness of the side surface portion 2CC is reduced, the region of the first chamfered portion 2CA is enlarged and the thickness of the end surface 2C becomes smaller with respect to the thickness t of the glass article 2, thereby reducing the bending stress generated on the end surface 2C and improving the impact resistance of the end surface 2C. The parameter R is preferably R≤22.17. In this case, the frequency of occurrence of cracks upon impact can be further reduced.

The width A of the first chamfered portion 2CA is preferably greater than 0 mm and 2 mm or less.

A glass article thickness ratio (A/t), which is a ratio of the width A of the first chamfered portion 2CA to the thickness t of the glass article 2, is preferably 0.77 or more, and more preferably 1.15 or more. In the case where the width A is within this range, the impact resistance of the end surface 2C can be more suitably improved.

The width B of the second chamfered portion 2CB is preferably greater than 0 mm and more preferably 1.0 mm or more, and is preferably 2 mm or less. That is, the width B of the second chamfered portion 2CB is preferably greater than 0 mm and 2 mm or less, and more preferably 1.0 mm or more and 2 mm or less.

A glass article thickness ratio (B/t), which is a ratio of the width B of the second chamfered portion 2CB to the thickness t of the glass article 2, is preferably 0.77 or more and more preferably 1.15 or more, and is preferably 4.0 or less and more preferably 2.86 or less. That is, B/t is preferably 0.77 or more and 4.0 or less, and more preferably 1.15 or more and 2.86 or less. In the case where the width B is within this range, the impact resistance of the end surface 2C can be more suitably improved.

The thickness C of the side surface portion 2CC is preferably equal to or less than the thickness t of the glass article 2 and more preferably 2 mm or less, and is preferably greater than 0 mm, more preferably 0.2 mm or more, and still more preferably 0.25 mm or more. That is, the thickness C of the side surface portion 2CC is more preferably greater than 0 mm and 2 mm or less, still more preferably 0.2 mm or more and 2 mm or less, and even more preferably 0.25 mm or more and 2 mm or less.

A glass article thickness ratio (C/t), which is a ratio of the thickness C of the side surface portion 2CC to the thickness t of the glass article 2, is preferably 0.6 or less, and more preferably 0.5 or less. In the case where the thickness C is within this range, the impact resistance of the end surface 2C can be more suitably improved.

The thickness D of the first chamfered portion 2CA is preferably greater than 0 mm and more preferably 0.1 mm or more, and is also preferably equal to or less than the thickness t of the glass article 2, and more preferably 2 mm or less. That is, the thickness D of the first chamfered portion 2CA is preferably greater than 0 mm and equal to or less than the thickness t of the glass article 2, more preferably greater than 0 mm and 2 mm or less, and still more preferably 0.1 mm or more and 2 mm or less.

A glass article thickness ratio (D/t), which is a ratio of the thickness D of the first chamfered portion 2CA to the thickness t of the glass article 2, is preferably 0.1 or more and more preferably 0.2 or more, and is also preferably 0.7 or less. That is, D/t is preferably 0.1 or more and 0.7 or less. In the case where the thickness D is within this range, the impact resistance of the end surface 2C can be more suitably improved.

That is, examples of a preferred embodiment of the chamfered portion include the followings.

(i) The width A of the first chamfered portion 2CA is 2 mm or less, and has a glass article thickness ratio (A/t) of 0.77 or more. The width B of the second chamfered portion 2CB has a glass article thickness ratio (B/t) of 0.77 or more and 4.0 or less. The thickness C of the side surface portion 2CC is 0.2 mm or more, and has a glass article thickness ratio (C/t) of 0.6 or less. The thickness D of the first chamfered portion 2CA has a glass article thickness ratio (D/t) of 0.1 or more and 0.7 or less.

(ii) The width A of the first chamfered portion 2CA is 2 mm or less, and has a glass article thickness ratio (A/t) of 1.15 or more. The width B of the second chamfered portion 2CB has a glass article thickness ratio (B/t) of 1.15 or more and 2.86 or less. The thickness C of the side surface portion 2CC is 0.2 mm or more, and has a glass article thickness ratio (C/t) of 0.6 or less. The thickness D of the first chamfered portion 2CA has a glass article thickness ratio (D/t) of 0.1 or more and 0.7 or less.

(iii) The width A of the first chamfered portion 2CA is 2 mm or less, and has a glass article thickness ratio (A/t) of 0.77 or more. The width B of the second chamfered portion 2CB is 1.0 mm or more and 2 mm or less. The thickness C of the side surface portion 2CC is 0.2 mm or more, and has a glass article thickness ratio (C/t) of 0.6 or less. The thickness D of the first chamfered portion 2CA has a glass article thickness ratio (D/t) of 0.1 or more and 0.7 or less.

(iv) The width A of the first chamfered portion 2CA is 2 mm or less, and has a glass article thickness ratio (A/t) of 0.77 or more. The width B of the second chamfered portion 2CB is 1.0 mm or more and 2 mm or less. The thickness C of the side surface portion 2CC is 0.2 mm or more, and has a glass article thickness ratio (C/t) of 0.6 or less. The thickness D of the first chamfered portion 2CA has a glass article thickness ratio (D/t) of 0.1 or more and 0.7 or less. Further, the first chamfered portion 2CA has a curved shape.

(v) The width A of the first chamfered portion 2CA is 2 mm or less, and has a glass article thickness ratio (A/t) of 1.15 or more. The width B of the second chamfered portion 2CB is 1.0 mm or more and 2 mm or less. The thickness C of the side surface portion 2CC is 0.2 mm or more, and has a glass article thickness ratio (C/t) of 0.6 or less. The thickness D of the first chamfered portion 2CA has a glass article thickness ratio (D/t) of 0.1 or more and 0.7 or less. Further, the first chamfered portion 2CA has an R-chamfered shape, and the second chamfered portion 2CB has a C-chamfered shape.

Further, examples of a preferred embodiment of the chamfered portion also include the followings.

In the following (vi) to (vii), the Young's modulus of the glass article is 60 GPa or more and 80 GPa or less, and the thickness C of the side surface portion 2CC is 0.2 mm or more. A glass article having a Young's modulus of 60 GPa or more and 80 GPa or less is suitable as a chemically strengthened glass used for a cover member of an in-vehicle display device. In the case where the thickness C of the side surface portion 2CC is 0.2 mm or more, chipping of the side surface portion during manufacturing can be reduced.

(vi) The thickness D of the first chamfered portion 2CA has a glass article thickness ratio (D/t) of greater than 0.25, and the width A of the first chamfered portion 2CA has a glass article thickness ratio (A/t) of greater than 1.0.

In the case where D/t is greater than 0.25, the width A of the first chamfered portion 2CA has a large effect on the impact resistance of the end surface 2C. Therefore, it is effective to increase the width A in particular. A/t is more preferably 1.10 or more, and still more preferably 1.5 or more.

(vii) The thickness D of the first chamfered portion 2CA has a glass article thickness ratio (D/t) of 0.25 or less, the width A of the first chamfered portion 2CA has a glass article thickness ratio (A/t) of 2.0 or less, and the width B of the second chamfered portion 2CB has a glass article thickness ratio (B/t) of 1.10 or more.

In the case where D/t is 0.25 or less, the width B has a relatively large effect on the impact resistance of the end surface 2C. Therefore, it is preferable to increase the width B in particular. In particular, for example, in the case where a glass article is used as a cover member for a display device, and in the case where the first chamfered portion 2CA that can be visually recognized by a user cannot be made large for design reasons, the impact resistance of the end surface 2C can be significantly improved by increasing the value of the width B. In this case, for example, the width B may be greater than the width A.

Further, examples of a preferred embodiment of the chamfered portion also include the followings.

In the following (viii) to (ix), the Young's modulus of the glass article is 60 GPa or more and 80 GPa or less, and the thickness C of the side surface portion 2CC is 0.2 mm or more. A glass having a Young's modulus of 60 GPa or more and 80 GPa or less is suitable as a chemically strengthened glass used for a cover of an in-vehicle display device. In the case where the thickness C of the side surface portion 2CC is 0.2 mm or more, chipping of the side surface portion during manufacturing can be reduced.

(viii) The width A of the first chamfered portion 2CA has a glass article thickness ratio (A/t) of greater than 1.5.

In the case where the width A is sufficiently large, the impact resistance of the end surface 2C is easily improved.

(ix) The width A of the first chamfered portion 2CA has a glass article thickness ratio (A/t) of 0.3 or more and 1.5 or less, the width B of the second chamfered portion 2CB has a glass article thickness ratio (B/t) of 0.7 or more, and the thickness D of the first chamfered portion 2CA has a glass article thickness ratio (D/t) of 0.14 or more.

Even in the case where the width A cannot be sufficiently increased, the impact resistance of the end surface 2C can be improved by increasing the thickness D and the width B and adjusting the balance of widths and thicknesses of the first chamfered portion 2CA and the second chamfered portion 2CB so as to satisfy Formulas (1) and (2).

(x) The width B of the second chamfered portion 2CB has a glass article thickness ratio (B/t) of greater than 1.5.

In the case where the width B is sufficiently large, the impact resistance of the end surface 2C is easily improved. In this case, the width A may be smaller than the width B.

Further, examples of a preferred embodiment of the chamfered portion also include the following.

(xi) The thickness C of the side surface portion 2CC is less than 0.2 mm.

In the case where the thickness C of the side surface portion 2CC can be sufficiently reduced, the impact resistance of the end surface 2C can be easily improved, and the width A and the width B can be selected relatively freely, expanding the design options.

As described above, it is important to determine the design of the end surface 2C by adjusting the balance of widths and thicknesses of the first chamfered portion 2CA and the second chamfered portion 2CB so as to satisfy Formulas (1) and (2). Therefore, it is preferable that the end surface 2C has an asymmetric shape. The asymmetric shape means that the values of the thickness D of the first chamfered portion and a thickness of the second chamfered portion (t−(C+D)) are different, or the values of the width A of the first chamfered portion and the width B of the second chamfered portion are different.

As described above, the glass article 2 according to the present embodiment has the first main surface 2A, the second main surface 2B, and the end surface 2C connecting the first main surface 2A and the second main surface 2B. The end surface 2C includes the side surface portion 2CC, the first chamfered portion 2CA connecting the side surface portion 2CC and the first main surface 2A, and the second chamfered portion 2CB connecting the side surface portion 2CC and the second main surface 2B. In the glass article 2, the parameter R shown in Formula (1) satisfies Formula (2). The glass article 2 according to the present embodiment has a shape in which the parameter R satisfies Formula (2), and thus can improve the end portion impact resistance and reducing cracks at end portions.

Figure 7B:
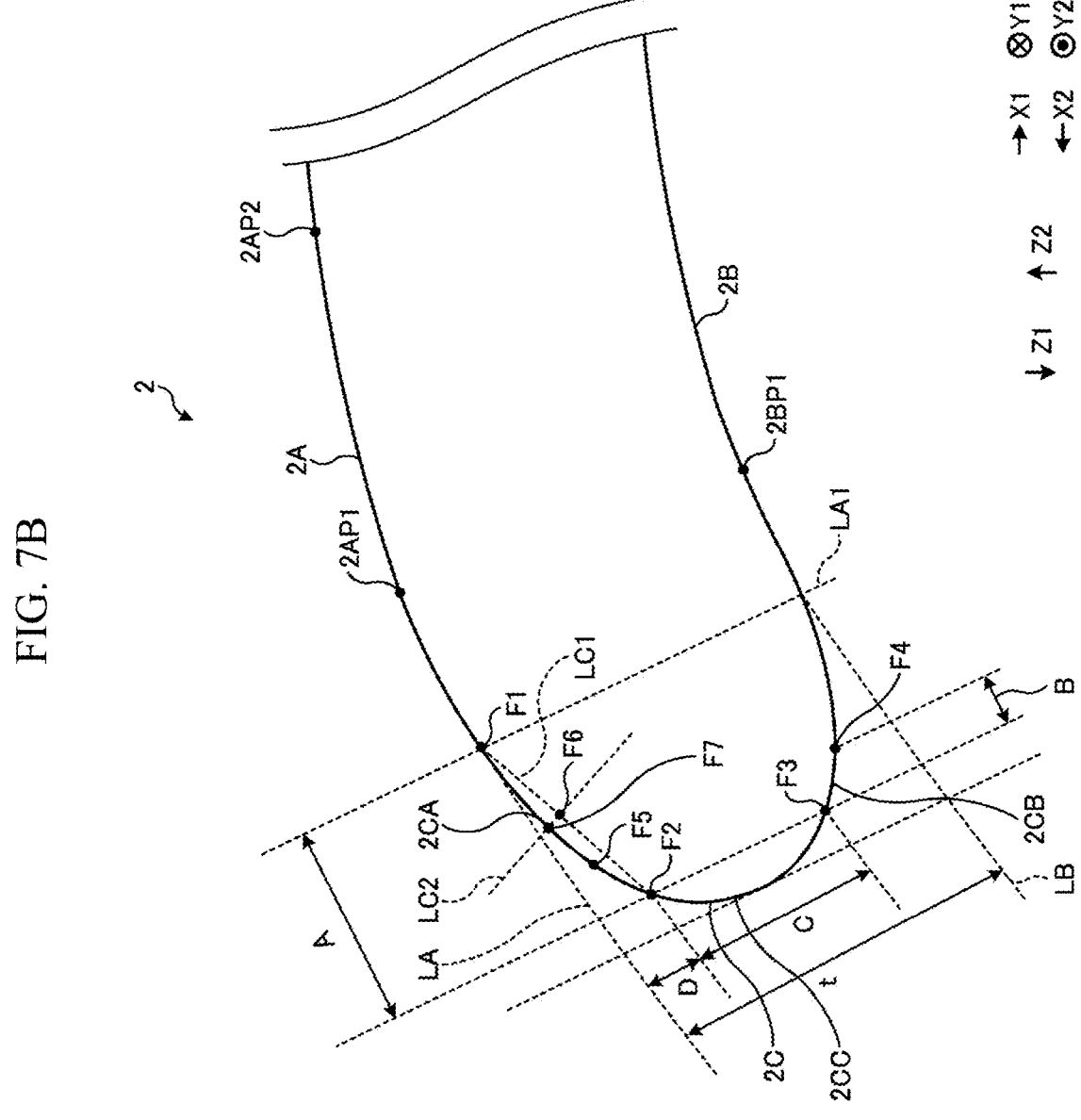
FIG. 7B is a schematic partially enlarged cross-sectional view of the glass article.

FIG. 7B is a schematic partially enlarged cross-sectional view of a glass article. FIG. 7A illustrates the case where the main surface of the glass article 2 is flat, but as illustrated in FIG. 7B, the main surface of the glass article 2 may be curved. Even in the case where the glass article 2 is curved, the numerical range of the parameter R, and thicknesses and widths of the first chamfered portion 2CA, the second chamfered portion 2CB, and the side surface portion 2CC may be as described above.

3. Configuration Example of Other Members of Display Device

Next, a configuration example of the display device 1 using the glass article 2 according to the present embodiment, more specifically, a configuration example of members other than the glass article 2 of the display device 1 will be described. Configurations of members other than the glass article 2 of the display device 1 are not limited to those described below.

(Display Panel)

The display panel 3 is a panel that displays an image, and is disposed on the direction Z1 side of the glass article 2 to overlap the glass article 2. In the display panel 3, a display surface which is a surface on the direction Z2 side is adhered to the second main surface 2B of the glass article 2 by an adhesive layer (not illustrated). The adhesive layer is, for example, an optical clear adhesive (OCA) film or an OCA tape, and the thickness (length in the Z direction) thereof is, for example, 5 μm or more and 400 μm or less, and preferably 50 μm or more and 200 μm or less.

The display panel 3 is a liquid crystal panel, an organic EL panel, a flexible organic EL panel, a PDP, an electronic ink panel, or the like, and may include a touch panel or the like. In the case where the display panel 3 includes a glass substrate, the glass substrate is the thickest and dominates rigidity of the entire display panel. Therefore, the Young's modulus of the glass substrate may be regarded as the Young's modulus of the display panel 3.

The Young's modulus of the display panel 3 is preferably 2 GPa or more, more preferably 60 GPa or more, and still more preferably 70 GPa or more. The Young's modulus of the display panel 3 is preferably 90 GPa or less, and more preferably 75 GPa or less. That is, the Young's modulus of the display panel 3 is preferably 2 GPa or more and 90 GPa or less, more preferably 60 GPa or more and 75 GPa or less, and still more preferably 70 GPa or more and 75 GPa or less.

The thickness of the display panel 3 is preferably 0.05 mm or more, more preferably 1.0 mm or more, and still more preferably 1.1 mm or more. The thickness of the display panel is preferably 2.0 mm or less, and more preferably 1.3 mm or less. That is, the thickness of the display panel 3 is preferably 0.05 mm or more and 2.0 mm or less. The thickness of the display panel 3 is a length in the Z direction from a main surface on the direction Z1 side to a main surface on the direction Z2 side of the display panel 3.

As illustrated in FIG. 1, when viewed from the Z direction, a distance from an end portion of the glass article 2 on the direction Y1 side to an end portion of the display panel 3 on the direction Y1 side is defined as a distance S1. From the viewpoint of adhering and holding the glass article 2 with sufficient adhesive strength, the distance S1 is preferably 2 mm or more and 30 mm or less, and more preferably 5 mm or more and 20 mm or less. The distance S1 is preferably 2 mm or more and more preferably 5 mm or more, and is preferably 30 mm or less and more preferably 20 mm or less. The numerical range of the distance S1 can also be applied to a distance from an end portion of the glass article 2 on the direction Y2 side to an end portion of the display panel 3 on the direction Y2 side.

As illustrated in FIG. 1, when viewed from the Z direction, a distance from an end portion of the glass article 2 on the direction X1 side to an end portion of the display panel 3 on the direction X1 side is defined as a distance S2. From the viewpoints of adhesive strength and design, the distance S2 is preferably 2 mm or more and 200 mm or less, and more preferably 5 mm or more and 150 mm or less. The distance S2 is preferably 2 mm or more and more preferably 5 mm or more, and is preferably 200 mm or less and more preferably 150 mm or less. The numerical range of the distance S2 can also be applied to a distance from an end portion of the glass article 2 on the direction X2 side to an end portion of the display panel 3 on the direction X2 side.

(Backlight Unit)

The backlight unit 4 is a light source that irradiates the display panel 3 with light for image display, and is disposed on the direction 21 side of the display panel 3 to overlap the display panel 3.

The backlight unit 4 is generally composed of members such as a lens sheet, a diffusion sheet, a light guide plate, a lamp, and a reflector. Among these members, usually, the light guide plate is the thickest and dominates rigidity of the entire backlight unit 4. Therefore, the Young's modulus of the light guide plate may be regarded as the Young's modulus of the backlight unit 4.

The Young's modulus of the backlight unit 4 is preferably 1 GPa or more, more preferably 2 GPa or more, and still more preferably 60 GPa or more. The Young's modulus of the backlight unit 4 is preferably 90 GPa or less, and more preferably 85 GPa or less. That is, the Young's modulus of the backlight unit 4 is preferably 1 GPa or more and 90 GPa or less, more preferably 2 GPa or more and 85 GPa or less, and still more preferably 60 GPa or more and 85 GPa or less.

The thickness of the backlight unit 4 is preferably 1 mm or more, more preferably 2 mm or more, and still more preferably 3 mm or more. The thickness of the backlight unit 4 is preferably 10 mm or less, more preferably 6 mm or less, and still more preferably 5 mm or less. That is, the thickness of the backlight unit 4 is preferably 1 mm or more and 10 mm or less. The thickness of the backlight unit 4 is a length in the Z direction from a main surface on the direction Z1 side to a main surface on the direction 22 side of the backlight unit 4.

The display device 1 may not be provided with the backlight unit 4. In this case, in the display device 1, the glass article 2, the display panel 3, and the bottom member 5 are disposed (overlapped) in this order in the direction Z1. In the case where the backlight unit 4 is not provided, a self-luminous display panel that does not require the backlight unit 4, such as an organic EL panel or a micro LED panel, is selected as the display panel 3.

(Bottom Member)

The bottom member 5 is disposed on the direction Z1 side of the display panel 3 (the backlight unit 4 in the present embodiment) to overlap the display panel 3 (the backlight unit 4 in the present embodiment), and can be said as being a bottom portion of the housing.

The bottom member 5 includes a plate portion 6. The plate portion 6 is a plate-shaped member disposed to overlap the display panel 3. The bottom member 5 may further include ribs 7. The ribs 7 are members formed to protrude from a main surface 6A of the plate portion 6 on the direction Z1 side, and have a quadrangular prism shape in the present embodiment. By forming the bottom member 5 into a shape having the ribs 7, the display device 1 can be made lighter in weight as compared with a case where the bottom member 5 is formed into a thick plate shape having no rib 7.

As illustrated in FIG. 3, when the bottom member 5 of the present embodiment is viewed from the direction Z1 side toward the direction Z2, a plurality of ribs 7 are provided in a grid shape in the bottom member 5. Specifically, a plurality of ribs 7 (rib 71, rib 72, rib 73, and rib 74) extending in the Y direction in FIG. 3 intersect a plurality of ribs 7 (rib 75, rib 76, and rib 77) extending in the X direction in FIG. 3. The shape of the ribs 7 is not limited to FIG. 3 and may be any shape, and may be, for example, a curved shape instead of a linear shape, or may not be provided in a grid shape. The bottom member 5 may not have the ribs 7. In this case, the bottom member 5 includes only the plate portion 6.

In FIG. 5, a fixing point P is formed on a main surface 5A of the bottom member 5 on the direction Z1 side. The fixing point P is a portion of the bottom member 5 serving as an interface to be fixed to a vehicle (to the interior portion 10 in the present embodiment), and is a portion to which a bracket 9, which will be described later, is to be attached in the present embodiment.

The bottom member 5 is fixed to the bracket 9 in a state where the main surface 5A is in contact with a fixing member (here, the bracket 9). When a region of the main surface 5A that comes into contact with the fixing member is defined as a contact region, it can be said that the fixing point P' is a point on the contact region. The fixing point P may be any position on the contact region. For example, in FIG. 4, the fixing point P (fixing points P1 to P4) is exemplified as a midpoint position in the X direction of a side positioned on the direction Y2 side among sides of each contact region. As described above, the fixing point P may be the midpoint position in the X direction of the side positioned on the direction Y2 side among the sides of the contact region. It can be said that one fixing point P is formed for each contact region. That is, in the case where there are a plurality of fixing points P, it can be said that a plurality of contact regions are formed at separate positions and one fixing point P is formed in each contact region. In the case where there is one fixing point P, it can be said that there is one contact region.

For example, in the case where the display device 1 (bottom member 5) is fixed to the bracket 9, a position on the main surface 5A overlapping a midpoint of one side of an end of a convex surface 9a of the bracket 9 (that is, a midpoint in the X direction of a side of the contact region on the direction Y2 side) may be set as the fixing point P. In the case where the bottom member 5 is fixed to the bracket 9 with a fixing tool such as a bolt, the fixing point P may be a portion of the main surface 5A where a hole (for example, a bolt hole), into which the fixing tool is inserted, is open, or in the case where the bottom member 5 is fixed to the bracket 9 with a plurality of fixing tools per contact region, the fixing point P may be positioned at a center position among portions where holes (for example, bolt holes), into which the fixing tools are inserted, are open. For example, in the case where the bottom member 5 is fixed to the bracket 9 with an adhesive or the like, the fixing point P may be a point on the contact region of the main surface 5A to which the adhesive is applied. For example, a protrusion may be formed on the main surface 5A of the bottom member 5 and the bottom member 5 may be fixed to a vehicle by inserting the protrusion into a recess formed in the vehicle (the interior portion 10 in the present embodiment). In this case, the protrusion of the bottom member 5 may be regarded as the bracket 9 without separately providing the bracket 9. In this case, a surface of the protrusion of the bottom member 5 on the direction Z1 side may be the contact region, and a point on the contact region may be the fixing point P. Alternatively, for example, a recess may be formed in the main surface 5A of the bottom member 5 and the bottom member 5 may be fixed to a vehicle by inserting a protrusion formed on the vehicle (the interior portion 10 in the present embodiment) into the recess of the main surface 5A. In this case, the protrusion of the vehicle may be regarded as the bracket 9 without separately providing the bracket 9. In this case, a surface of the recess of the bottom member 5 on the direction Z1 side may be the contact region, and a point on the contact region may be the fixing point P. The position of the fixing point P and the like will be described later.

For example, in the case where the bottom member 5 has the ribs 7, the Young's modulus is preferably 1.5 GPa or more and 100 GPa or less, and more preferably 40 GPa or more and 80 GPa or less. In the case where the bottom member 5 has the ribs 7, the Young's modulus is preferably 1.5 GPa or more and more preferably 40 GPa or more, and is preferably 100 GPa or less and more preferably 80 GPa or less. For example, in the case where the bottom member 5 does not have the rib 7, the Young's modulus is preferably 40 GPa or more and 250 GPa or less, and more preferably 60 GPa or more and 230 GPa or less. In the case where the bottom member 5 does not have the rib 7, the Young's modulus is preferably 40 GPa or more and more preferably 60 GPa or more, and is preferably 250 GPa or less and more preferably 230 GPa or less.

As a material of the bottom member 5, for example, a metal (simple substance) or an alloy containing a metal element such as aluminum or magnesium is preferred. The material of the bottom member 5 may be resin or a laminate of a resin layer and a metal layer.

(Sidewall Member)

The sidewall member 8 is a frame-shaped member that is provided to surround the glass article 2, the display panel 3, and the backlight unit 4 when viewed from the Z direction, and can be said as being a side wall portion of the housing.

In FIG. 2, in the example of the present embodiment, the sidewall member 8 includes sidewall members 8a and 8b. The sidewall member 8a includes members 8a1 and 8a2. The member 8a1 is a frame-shaped portion surrounding the glass article 2. The member 8a2 is a portion that protrudes from an end portion of the member 8a1 on the direction Z1 side toward the inside of the glass article 2 along the Z direction. The central axis of the glass article 2 is an axis that passes through a center point of the glass article 2 when viewed from the Z direction and extends in the Z direction. The member 8a2 supports an outer peripheral region of the second main surface 2B of the glass article 2 on the direction Z1 side with a surface on the direction Z2 side that protrudes from the member 8a1. In the present embodiment, the member 8a2 and the glass article 2 are adhered via an adhesive layer.

The sidewall member 8b is a frame-shaped member provided on the direction Z1 side of the sidewall member 8a, and is disposed to surround the display panel 3 and the backlight unit 4 in the present embodiment. In the present embodiment, a surface of the sidewall member 8b on the direction Z2 side is adhered to the sidewall member 8a via an adhesive layer.

The shapes of the sidewall members 8a and 8b are not limited to those described above, and may be any shape. In the present embodiment, although the two sidewall members 8a and 8b are provided as the sidewall member 8, the configuration of the sidewall member 8 is not limited thereto, and may be any configuration. For example, the sidewall member 8 may be constituted by one member, or may be constituted by three or more members.

The Young's modulus of the sidewall member 8 is preferably 1 GPa or more and 250 GPa or less, and more preferably 2 GPa or more and 20 GPa or less. The Young's modulus of the sidewall member 8 is preferably 1 GPa or more and more preferably 2 GPa or more, and is preferably 250 GPa or less and more preferably 20 GPa or less. In the case where the sidewall member 8 is constituted by a plurality of members, it is preferable that the Young's modulus of each member falls within the above range.

As a material of the sidewall member 8, for example, a metal (simple substance) or an alloy containing a metal element such as aluminum or magnesium is preferred. The material of the sidewall member 8 may be resin or a laminate of a resin layer and a metal layer. In the case where the sidewall member 8 is constituted by a plurality of members, each member may be made of a different material.

In the present embodiment, although the sidewall member 8 is a member separate from the bottom member 5, the present invention is not limited thereto, and the sidewall member 8 and the bottom member 5 may be an integrated member. In addition, for example, among the plurality of members constituting the sidewall member 8, a part of the members may be integrated with the bottom member 5, and some other members may be separated from the bottom member 5. That is, for example, the sidewall member 8b may be integrated with the bottom member 5, and the sidewall member 8a may be separated from the bottom member 5.

Although the display device 1 of the present embodiment is configured as described above, the display device 1 is not limited to those described above and may have any configuration. For example, although the bottom member 5 is disposed most on the direction Z1 side among the members of the display device 1 in the example of the present embodiment, the present invention is not limited thereto, and for example, another member may be provided further on the direction Z1 side than the bottom member 5. That is, even in the case where there is another member further disposed on the direction Z1 side than the bottom member 5, a layer (bottom member 5) on which the fixing point P is formed is treated as the bottom member in the present embodiment. In other words, the layer on which the fixing point P is formed and which is disposed most on the direction Z1 side is treated as the bottom member 5.

4. Fixed State of Display Device

Next, a state in which the display device 1 is fixed to the interior portion 10 of a vehicle will be described. Hereinafter, fixing of the display device 1 will be described.
(Fixing Point)

As described above, the fixing point P to be fixed to the interior portion 10 is formed on the main surface 5A of the bottom member 5 of the display device 1 on the direction Z1 side. In the present embodiment, a plurality of fixing points P are provided, and in the example of FIG. 4, four fixing points P1, P2, P3, and P4 are provided. The fixing points P1 and P2 are disposed in the X direction (a width direction of the vehicle in the case where the display device 1 is attached to a vehicle). The fixing points P3 and P4 are positioned on the direction Y2 side with respect to the fixing points P1 and P2 (on a lower side in the vertical direction in the case where the display device 1 is attached to a vehicle), and are disposed in the X direction. A line passing through the fixing points P1 and P2 and a line passing through the fixing points P3 and P4 are parallel to each other, and the fixing points P1 to P4 form four vertices of a rectangle.

As illustrated in FIGS. 1, 2, 4, and 5, the bracket 9 as a fixing member may be attached to the fixing point P. In this case, the bottom member 5 is fixed to the interior portion 10 via the bracket 9. In the example of the present embodiment, as illustrated in FIG. 4, a bracket 91 is attached to the fixing point P1, a bracket 92 is attached to the fixing point P2, a bracket 93 is attached to the fixing point P3, and a bracket 94 is attached to the fixing point P4.

As illustrated in FIG. 5, the bracket 9 is a long plate-shaped member and is bent in a U-shape. A center of the bracket 9 in a plate width direction is positioned at the fixing point P. In the bracket 9, one side of the end of the convex surface 9a (a surface on the direction Y2 side in FIG. 5) formed by being bent in a U-shape is in contact with the fixing point P. A direction perpendicular to the convex surface 9a of the bracket 9 intersects perpendicularly with the X direction (the width direction of the vehicle). In the bracket 9, one surface 9b connected to the convex surface 9a is in contact with the bottom member 5, and the other surface 9c connected to the convex surface 9a is in contact with the interior portion 10. That is, the position on the main surface 5A of the bottom member 5 overlapping the midpoint of the one side of the end of the convex surface 9a of the bracket 9 (that is, the midpoint in the X direction of the side of the contact region on the direction Y2 side) is the fixing point P. The bracket 9 is fixed to the bottom member 5 and the interior portion 10 with, for example, a screw (not illustrated). The shape of the bracket 9 is not limited to that described above, and may be bent in an S-shape, for example.

Since the display device 1 is attached to a vehicle via the bracket 9 as described above, it can be said that the display device 1 and the bracket 9 constitute a display device unit.

The bottom member 5 may be fixed to the interior portion 10 by, for example, deforming a part of the bottom member 5 without using the bracket 9. Alternatively, a part of the interior portion 10 may be deformed and fixed to the bottom member 5. In these cases, each fixing point P may be defined as a center of each fixing portion.

The positions and the number of the fixing points P are not limited to those described above. A plurality of fixing points P may be formed in any number, and each fixing point P in this case may be at any position.
(Intermediate Point PQ)

In the following, an intermediate point PQ is defined to explain the position of the fixing point P in the Y direction with respect to the display device 1 ($YH/YH_{cg}$ which will be described later). The intermediate point PQ is a midpoint between the fixing point P1 and the fixing point P2. When a distance between the intermediate point PQ and the fixing point P1 (or a distance between the intermediate point PQ and the fixing point P2) is defined as a distance X, the distance X is preferably 30 mm or more and 200 mm or less, and more preferably 50 mm or more and 130 mm or less, from the viewpoint of obtaining favorable vibration characteristics (JIS D) 1601:1995, vibration test method for automobile parts). The distance X is preferably 30 mm or more and more preferably 50 mm or more, and is preferably 200 mm or less and more preferably 130 mm or less.

When a distance between the fixing point P1 and the fixing point P3 disposed in the Y direction (or a distance between the fixing point P2 and the fixing point P4) is defined as a distance Y, the distance Y is preferably 30 mm or more and 200 mm or less, and more preferably 35 mm or more and 125 mm or less for the same reason as for the distance X. The distance Y is preferably 30 mm or more and more preferably 35 mm or more, and is preferably 200 mm or less and more preferably 125 mm or less.

Since the number and positions of the fixing points P are arbitrary as described above, the definition of the intermediate point PQ for each variation of the positions of the fixing points P will be described below.

Among the fixing points P provided on the bottom member 5, two fixing points P are selected from the direction Y1 side (an upper side in the vertical direction), and a midpoint between the two selected fixing points P is set as an intermediate point PQ. For example, FIGS. 1 to 5 illustrate an example in which the bottom member 5 is fixed to the interior portion 10 at four fixing points P (fixing points P1 to P4) disposed two by two in the Y direction. As illustrated in FIGS. 1 to 5, in the case where there are a plurality of fixing points P in the Y direction, two fixing points most on the direction Y1 side (the fixing point P1 and the fixing point P2 in FIGS. 1 to 4) are used as the fixing points P for defining the intermediate point PQ (and a virtual plane T which will be described later).

In the case where there are three or more fixing points P at the same position in the Y direction (the same height), two fixing points P having the smallest interval therebetween are selected, and a midpoint therebetween is set as the intermediate point PQ. In the case where there are three or more fixing points at equal intervals at the same position in the Y direction, a midpoint of two fixing points P of any combination of two fixing points having the smallest interval may be set as the intermediate point PQ. That is, in the case where there are a plurality of candidates for the intermediate point PQ (and the virtual plane T which will be described later), any one of the candidates may satisfy the requirements of the present embodiment.

The bottom member 5 may be fixed to the interior portion 10 at three fixing points P. For example, when explaining by referring to FIG. 4, it can be assumed a case where the fixing point P1 and the fixing point P2 are not present and, instead, another fixing point P' (not illustrated in FIG. 4 and the like) is present on a line connecting the fixing point P1 and the fixing point P2. In this case, the bottom member 5 is fixed to the interior portion 10 at three points of the fixing point P3, the fixing point P4, and the fixing point P'. At this time, in the case where there is no difference in position in the Y direction (height) between the fixing point P3 and the fixing point P4, the fixing point closer to the fixing point P' is selected, and a midpoint between the selected fixing point and the fixing point P' is set as the intermediate point PQ. In the case where there is no difference in distance from the fixing point P', either the fixing point P3 or the fixing point P4 is selected, and a midpoint between the selected fixing point and the fixing point P' is set as the intermediate point PQ. In the case where the fixing point P3 and the fixing point P4 are positioned at different positions in the Y direction, two fixing points P (the fixing point P' and the fixing point on the direction Y1 side among the fixing point P3 and the fixing point P4) are selected from the direction Y1 side, and a midpoint between the selected fixing points is set as the intermediate point PQ, similarly to the definition in the case of having four fixing points P.

(YH/YH$_{cg}$)

As illustrated in FIG. 4, a plane that passes through the intermediate point PQ and is perpendicular to the line connecting the fixing point P1 and the fixing point P2 (two fixing points P used to define the intermediate point PQ) is defined as the virtual plane T. As illustrated in FIG. 5, a length of an intersection line between the glass article 2 and the virtual plane T is defined as a distance YH$_{cg}$. In addition, as illustrated in FIG. 5, a length of an intersection line between the main surface of the display panel 3 and the virtual plane T from the upper end of the display panel 3 (the end portion on the direction Y1 side) to a point corresponding to the intermediate point PQ is defined as a distance YH. The "point corresponding to the intermediate point PQ" is a point where the intermediate point PQ is moved in the thickness direction (Z direction) of the display device 1 and is positioned on the main surface of the display panel 3. In the display device 1, the position of the fixing point P is preferably set so that the ratio YH/YH$_{cg}$ of the distance YH to the distance YH$_{cg}$ is 0.5 or less. That is, it can be said that the display device 1 is preferably a display device of an "in-dash type or on-dash type (hereinafter, also simply referred to as "in-dash type")" in which the vicinity of the upper end is also fixed to the interior portion 10. In the display device 1, the ratio YH/YH$_{cg}$ is more preferably 0.1 or more and 0.5 or less, and still more preferably 0.3 or more and 0.5 or less. YH/YH$_{cg}$ is preferably 0.1 or more and more preferably 0.3 or more, and is preferably 0.5 or less.

In the case where the ratio YH/YH$_{cg}$ is greater than 0.5, it can be said that the display device 1 corresponds to a "standing type" in which only a lower end of the bottom member is fixed to the dashboard.

The display device 1 is fixed to a vehicle as described above.

5. Layer Configuration of Display Device

Next, a preferred layer configuration of the display device 1 will be described.

(Equidistance Point H0 and Reference Point H)

As illustrated in FIG. 7A, the boundary position (corner portion) between the first main surface 2A of the glass article 2 and the first chamfered portion 2CA of the end surface 2C is defined as the boundary position F1 as described above. The boundary position between the first chamfered portion 2CA and the side surface portion 2CC of the end surface 2C of the glass article 2 is defined as the boundary position F2 as described above.

A straight line connecting the boundary position F1 and the boundary position F2 is defined as LC1. On the straight line LC1, a point at a distance of 0.25 mm from the boundary position F2 toward the boundary position F1 is defined as a point F6. A line passing through the point F6 and perpendicular to the straight line LC1 is defined as a straight line LC2. An intersection point between the straight line LC2 and the first chamfered portion 2CA is defined as a point F7.

In this case, as illustrated in FIG. 4, on the point F7 of the glass article 2 on the direction Y1 side, when viewed from the Z direction, a position where a distance from each of the two fixing points P used to define the intermediate point PQ is equal is defined as an equidistance point H0. In the example of the present embodiment, since the fixing points P1 and P2 are used to define the intermediate point PQ, it can be said that the equidistance point H0 is a point where a distance from the fixing point P1 is equal to a distance from the fixing point P2 on the point F7 of the glass article 2 on the direction Y1 side, when viewed from the Z direction. That is, in the example of the present embodiment, a distance L1 from the equidistance point H0 to the fixing point P1 when viewed from the Z direction is equal to a distance L2 from the equidistance point H0 to the fixing point P2 when viewed from the Z direction.

In an extending direction of the point F7 of the glass article 2 on the direction Y1 side (the X direction in the example of FIG. 4), positions on the point F7 separated from the equidistance point H0 by a predetermined distance V1 are taken as points H1 and H2. That is, in the example of FIG. 4, the point H1 is a position on the point F7 separated from the equidistance point H0 by the predetermined distance V1 in the direction X2, and the point H2 is a position on the point F7 separated from the equidistance point H0 by the predetermined distance V1 in the direction X1. In this case, a reference point H is set as arbitrary position between the point H1 and the point H2 on the point F7 of the glass article 2 in the direction Y1. That is, it can be said that the reference point H is a position on the point F7 between a position (the point H1 in the example of FIG. 4) separated by the predetermined distance V1 from the equidistance point H0 in one direction (the direction X2 side in the example of FIG. 4) in the extending direction of the point F7 and a position (the point H2 in the example of FIG. 4) separated by the predetermined distance V1 in one direction (the direction X1 side in the example of FIG. 4) in the extending direction of the point F7. The predetermined distance V1 may be freely set, and may be, for example, 18 mm.

The reference point H may be any position between the point H1 and the point H2 on the point F7 on the direction Y1 side, and is preferably a position where the rigidity becomes minimum among positions between the point H1 and the point H2 on the point F7 on the direction Y1 side. In the example of the present embodiment, since among the positions between the point H1 and the point H2, the position where the rigidity becomes minimum is the equidistance point H0, the equidistance point H0 is treated as the reference point H.

The reference point H is not limited to the position where the rigidity becomes minimum between the point H1 and the point H2. For example, the equidistance point H0 may be treated as the reference point H without considering the rigidity.

The reference point H may be, for example, a position of a hitting point where an impactor collides in the head impact test.

(Virtual Line V)

Next, a virtual line V is defined. The C-C cross section illustrated in FIG. 4 is a cross section along the Y direction passing through the reference point H, and is, for example, as illustrated in FIG. 6. As illustrated in FIG. 6, a virtual line that passes through the reference point H and the bottom member 5 and is inclined at an angle θ with respect to the Z direction is defined as the virtual line V. That is, it can be said that the virtual line V is a line passing through the reference point H and inclined inward in a radial direction by the angle θ with respect to the Z direction. The radial direction refers to a radial direction when the central axis of the glass article 2 passing through the Z direction is taken as the axial direction. As described above, the central axis of the glass article 2 is an axis that passes through the center point of the glass article 2 when viewed from the Z direction and extends in the Z direction. In the present embodiment, the angle θ is 30° or more and 45° or less. It can be said that the virtual line V corresponds to a direction in which a high impact is transmitted when an impact is applied to the boundary position F1 in the head impact test or the like.

(Layer Configuration on Virtual Line V)

In the display device 1, members up to the n-th layer are disposed on the virtual line V defined as described above with the glass article 2 as the first layer, except for the bottom member 5. Here, the number represented by n is an integer of 2 or more. That is, it can be said that in the display device 1, it is preferable that the glass article, (n−1) members other than the glass article 2 and the bottom member 5, and the bottom member 5 are disposed along the virtual line V. In the example of FIG. 6, in the display device 1, the glass article 2 as the first layer, the sidewall member 8a as the second layer, the sidewall member 8b as the third layer, and the bottom member 5 are disposed in this order along the virtual line V, and in this example, n=3.

The number represented by n, that is, the total number of the glass article 2 and the other members than the bottom member 5 on the virtual line V is 2 or more, preferably 3 or more, and more preferably 4 or more. The number represented by n is also preferably 20 or less, and more preferably 10 or less. That is, the number represented by n is, for example, 2 to 20.

In the display device 1 according to the present embodiment, the glass article 2, the display panel 3, and the bottom member 5 to be fixed to a vehicle are stacked, and the second main surface 2B of the glass article 2 is positioned on the display panel side (direction Z1 side).

When a direction from the glass article 2 toward the bottom member 5 in the thickness direction (Z direction) of the glass article 2 is defined as the first direction (direction Z1), the bottom member 5 has the plate portion 6 and the ribs 7 protruding from the main surface 6B of the plate portion 6 on the direction Z1 side, and at least two fixing points P to be fixed to a vehicle are formed on the main surface on the direction Z1 side. When a virtual plane passing through an intermediate point PQ of two of at least two fixing points P and perpendicular to a line connecting the two fixing points P is defined as the virtual plane T, a length of an intersection line between the first main surface 2A and the virtual plane T is defined as a distance $YH_{cg}$, and a length of an intersection line between the main surface of the display panel 3 and the virtual plane T from an upper end to a point corresponding to the intermediate point PQ is defined as a distance YH, the ratio $YH/YH_{cg}$ of the distance YH to the distance $YH_{cg}$ is 0.5 or less.

The display device 1 according to the present embodiment is an in-dash type in-vehicle display device having the ratio $YH/YH_{cg}$ of 0.5 or more. In particular, in such an in-dash type display device, it is required to improve the end portion impact resistance and reduce cracks at end portions of the glass article 2. On the other hand, since the display device 1 according to the present embodiment is designed so that the glass article 2 satisfies Formula (2), it is possible to improve the end portion impact resistance and reduce cracks at end portions of the glass article 2.

6. Other Examples

Figure 8:
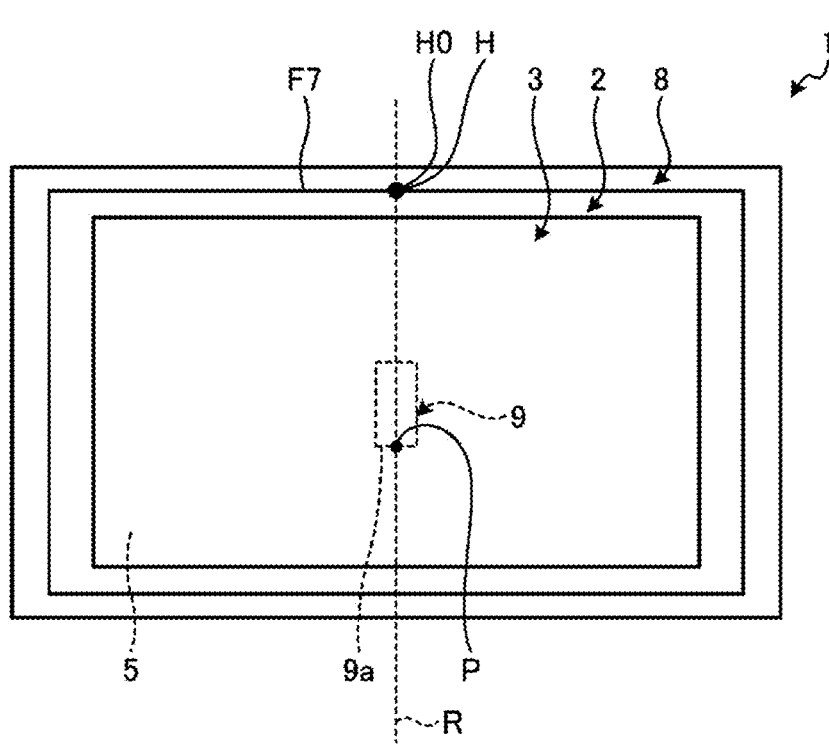
FIG. 8 is a schematic diagram of a display device according to another example of the present embodiment.

Although a plurality of fixing points P are formed in the above description of the embodiment, the number of fixing points P may be one. Since the definitions of the virtual plane T and the reference point H in the case where there is one fixing point P are different from those in the case where there are a plurality of fixing points P, this will be described below. FIG. 8 is a schematic diagram of a display device according to another example of the present embodiment.

As illustrated in FIG. 8, the bottom member 5 is fixed to a vehicle at one fixing point P. In the example of FIG. 8, the bottom member 5 is fixed to the bracket 9 at the one fixing point P, thereby being fixed to the vehicle via the bracket 9.

In the case where there is one fixing point P in this way, a virtual plane perpendicular to a side, which is in contact with the bottom member 5, of the convex surface 9a of the bracket 9 disposed at the one fixing point P, is defined as the virtual plane T for defining the distance YH and the distance $YH_{cg}$ (see FIG. 4). A virtual plane that passes through the fixing point P and extends along the thickness direction (Z direction) of the glass article 2 at the fixing point P and the vertical direction (Y direction) when the glass article 2 is mounted on the vehicle may be defined as the virtual plane T.

In the case where there is one fixing point P in this way, as illustrated in FIG. 8, a position where a distance from the fixing point P is the shortest when viewed from the Z direction on the boundary position F1 of the glass article 2 on the direction Y1 side is defined as the equidistance point H0. A method for defining the reference point H based on the equidistance point H0 is the same as that in the above embodiment, and thus the description thereof will be omitted. In the example of FIG. 8, the position of the equidistance point H0 is the reference point H.

As described above, the definitions of the virtual plane T and the reference point H in the case where there is one fixing point P are different from those in the case where there are a plurality of fixing points P. However, the other points may be treated as the same. That is, it can be said that even in the case where there is one fixing point P, it is preferable that the display device 1 satisfies Formula (2).

Figure 9:
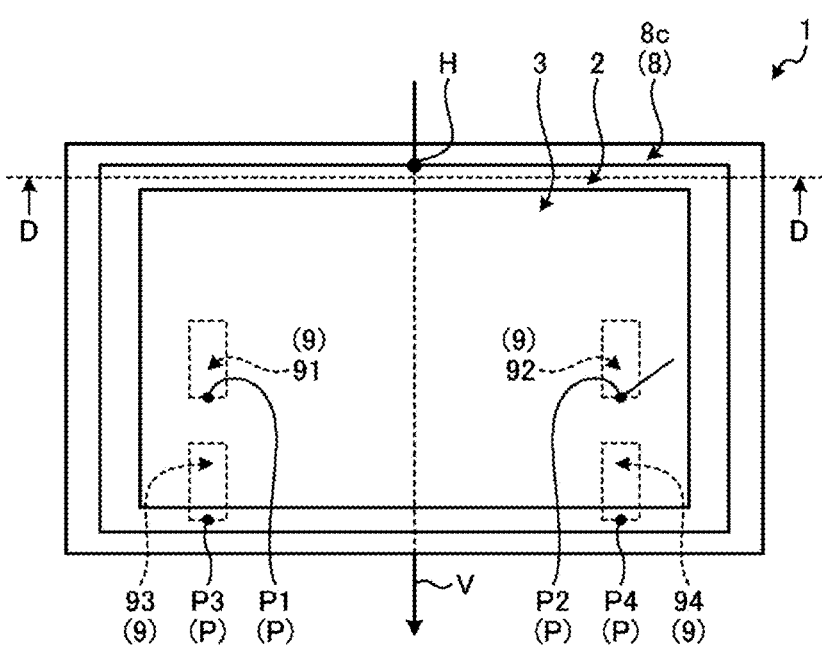
FIG. 9 is a schematic diagram of a display device according to another example of the present embodiment.
Figure 10:
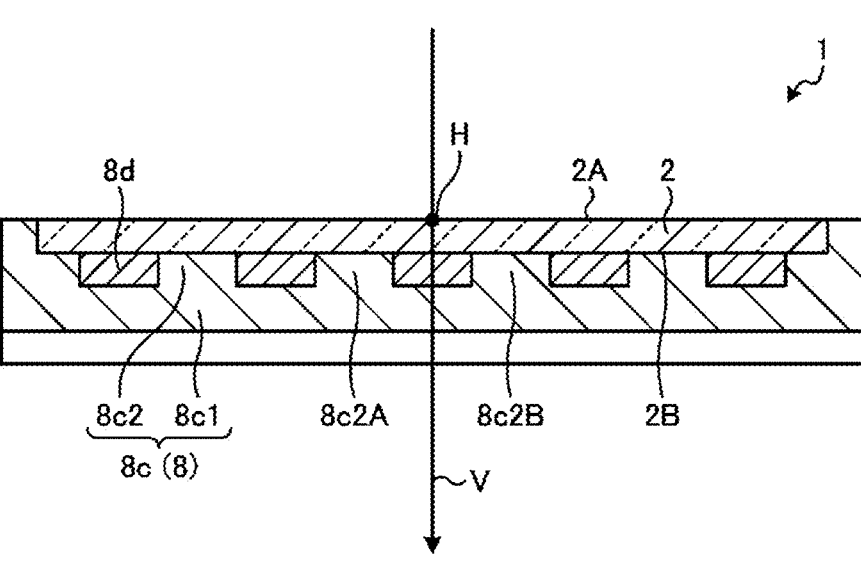
FIG. 10 is a cross-sectional view taken along line D-D in FIG. 9.

FIG. 9 is a schematic diagram of a display device according to another example of the present embodiment, and FIG. 10 is a cross-sectional view taken along line D-D in FIG. 9. At least one of the members (intermediate members) other than the glass article 2 and the bottom member 5 on the virtual line V may have a rib on a surface on the direction Z2 side. Hereinafter, as illustrated in FIGS. 9 and 10, a case where a sidewall member 8c is provided as the sidewall member 8 and the sidewall member 8c has a rib will be described as an example.

As illustrated in FIG. 10, the sidewall member 8c includes a base portion 8c1 and ribs 8c2. The base portion 8c1 is a frame-shaped member surrounding the glass article 2 and the display panel 3. The ribs 8c2 are members that protrude from a surface of the base portion 8c1 on the direction Z2 side. In the example of FIG. 10, the ribs 8c2 extend along the Y direction, and a plurality of the ribs 8c2 are disposed along the X direction. Surfaces of the ribs 8c2 on the direction Z2 side are adhered to the second main surface 2B of the glass article 2 on the direction Z1 side via, for example, an adhesive layer. Although a resin layer 8d is filled between the ribs 8c2, the present invention is not limited thereto, and a cavity in which nothing is filled may be formed. The adhesive layer and the resin layer 8d may not be treated as members on the virtual line V.

Although an example in which a rib is provided on one of the members (intermediate members) other than the glass article 2 and the bottom member 5 on the virtual line V has been described in the above description, the ribs may be formed on surfaces of a plurality of intermediate members on the direction Z2 side.

Although the base portion has a frame shape in the example of FIG. 10 since the sidewall member 8c is taken as an example, the base portion is not limited to the frame shape and may have any shape. For example, the base portion may be a flat plate-shaped member. The shape, the number, and the arrangement of the ribs are not limited to those in the example of FIG. 10, and may be any shape, number, and arrangement.

The present disclosure describes the following invention. The present invention is not limited thereto.

(1) A glass article 2 including a first main surface 2A, a second main surface 2B, and an end surface 2C connecting the first main surface 2A and the second main surface 2B, in which the end surface 2C includes a side surface portion 2CC, a first chamfered portion 2CA connecting the side surface portion 2CC and the first main surface 2A, and a second chamfered portion 2CB connecting the side surface portion 2CC and the second main surface 2B, and a parameter R defined by Formula (1) satisfies Formula (2).

$$R = 0.38 \cdot E_{cg} - A/t - 2.61 \cdot B/t + 4.38 \cdot C/t - 10.6 \cdot D/t \quad (1)$$

$$R \leq 23.58 \quad (2)$$

In Formula (1), $E_{cg}$ is a Young's modulus (GPa) of the glass article, A is a width (mm) of the first chamfered portion, B is a width (mm) of the second chamfered portion, C is a thickness (mm) of the side surface portion, D is a thickness (mm) of the first chamfered portion, and t is a thickness (mm) of the glass article.

(2) The glass article according to (1), in which the width A of the first chamfered portion 2CA is greater than 0 mm and 2 mm or less, the width B of the second chamfered portion 2CB is greater than 0 mm and 2 mm or less, the thickness C of the side surface portion 2CC is greater than 0 mm and 2 mm or less, and the thickness D of the first chamfered portion 2CA is greater than 0 mm and 2 mm or less.

(3) The glass article according to (1) or (2), in which the glass article includes a strengthened glass having a compressive stress layer with a thickness of 10 μm or more, has a thickness of 0.5 mm or more and 2.5 mm or less, and has a Young's modulus of 60 GPa or more and 90 GPa or less.

(4) The glass article according to any one of (1) to (3), in which the width B of the second chamfered portion 2CB is 1.0 mm or more.

(5) The glass article according to any one of (1) to (4), in which the thickness C of the side surface portion 2CC is 0.25 mm or more.

(6) The glass article according to any one of (1) to (5), in which the thickness D of the first chamfered portion 2CA is 0.1 mm or more and 0.7 times or less with respect to the thickness t of the glass article 2.

(7) The glass article according to any one of (1) to (6), in which the end surface has an asymmetric shape, and values of the thickness D of the first chamfered portion and a thickness of the second chamfered portion (t−(C+D)) are different, or values of the width A of the first chamfered portion and the width B of the second chamfered portion are different.

(8) The glass article according to any one of (1) to (3) and (7), in which the width A of the first chamfered portion 2CA is 2 mm or less, a glass article thickness ratio (A/t) which is a ratio of the width A to the thickness t of the glass article 2 is 0.77 or more, the width B of the second chamfered portion 2CB is 1.0 mm or more and 2 mm or less, the thickness C of the side surface portion 2CC is 0.2 mm or more, a glass article thickness ratio (C/t) which is a ratio of the thickness C of the side surface portion 2CC to the thickness t of the glass article 2 is 0.6 or less, and a glass article thickness ratio (D/t) which is a ratio of the thickness D of the first chamfered portion 2CA to the thickness t of the glass article 2 is 0.1 or more and 0.7 or less.

(9) The glass article according to any one of (1) to (3) and (7), in which the Young's modulus is 60 GPa or more and 80 GPa or less, the thickness C of the side surface portion 2CC is 0.2 mm or more, the thickness D of the first chamfered portion 2CA has a glass article thickness ratio (D/t) of greater than 0.25, and the width A of the first chamfered portion 2CA has a glass article thickness ratio (A/t) of greater than 1.0.

(10) The glass article according to any one of (1) to (3) and (7), in which the Young's modulus is 60 GPa or more and 80 GPa or less, the thickness C of the side surface portion 2CC is 0.2 mm or more, the thickness D of the first chamfered portion 2CA has a glass article thickness ratio (D/t) of 0.25 or less, the width A of the first chamfered portion 2CA has a glass article thickness ratio (A/t) of 2.0 or less, and the width B of the second chamfered portion 2CB has a glass article thickness ratio (B/t) of 1.10 or more.

(11) The glass article according to any one of (1) to (3) and (7), in which the Young's modulus is 60 GPa or more and 80 GPa or less, the thickness C of the side surface portion 2CC is 0.2 mm or more, and the width A of the first chamfered portion 2CA has a glass article thickness ratio (A/t) of greater than 1.5.

(12) The glass article according to any one of (1) to (3) and (7), in which the Young's modulus is 60 GPa or more and 80 GPa or less, the thickness C of the side surface portion 2CC is 0.2 mm or more, the width A of the first chamfered portion 2CA has a glass article thickness ratio (A/t) of 0.3 or more and 1.5 or less, the width B of the second chamfered portion 2CB has a glass article thickness ratio (B/t) of 0.7 or more, and the thickness D of the first chamfered portion 2CA has a glass article thickness ratio (D/t) of 0.14 or more.

(13) The glass article according to any one of (1) to (3) and (7), in which the Young's modulus is 60 GPa or more and 80 GPa or less, the thickness C of the side surface portion 2CC is 0.2 mm or more, and the width A of the first chamfered portion 2CA has a glass article thickness ratio (A/t) of greater than 1.5.

(14) The glass article according to any one of (1) to (3) and (7), in which the Young's modulus is 60 GPa or more and 80 GPa or less, the thickness C of the side surface portion 2CC is 0.2 mm or more, and the width B of the second chamfered portion 2CB has a glass article thickness ratio (B/t) of greater than 1.5.

(15) The glass article according to any one of (1) to (3), and (7), in which the thickness C of the side surface portion 2CC is less than 0.2 mm.

(16) The glass article according to any one of (1) to (15), in which the glass article is used as a cover member of an in-vehicle display device 1.

(17) The glass article according to (16), in which a printed layer is provided on the second main surface 2B.

(18) An in-vehicle display device, including the glass article 2 described in any one of (1) to (17), a display panel 3, and a bottom member 5 configured to be fixed to a vehicle, in a stacked manner, and the second main surface 2B of the glass article 2 is positioned to face the display panel 3.

(19) The display device according to (18), in which the glass article 2 has a Young's modulus of 60 GPa or more and 90 GPa or less, the display panel 3 has a Young's modulus of 20 GPa or more and 90 GPa or less, and the bottom member 5 has a Young's modulus of 40 GPa or more and 250 GPa or less.

(20) The display device according to (18) or (19), in which when a direction from the glass article 2 toward the bottom member 5 in a thickness direction of the glass article 2 is defined as a first direction (direction Z1), the bottom member 5 includes a plate portion 6 and a rib 7 protruding from a main surface of the plate portion 6 on the first direction side, and at least two fixing points P to be fixed to a vehicle are formed on the main surface on the first direction side, and when a virtual plane passing through an intermediate point of two fixing points P and perpendicular to a line connecting the two fixing points P is defined as a virtual plane T, a length of an intersection line between a main surface of the glass article 2 and the virtual plane T is defined as a distance $YH_{cg}$, and a length of an intersection line between a main surface of the display panel 3 and the virtual plane T from an upper end to a point corresponding to the intermediate point is defined as a distance YH, a ratio $YH/YH_{cg}$ of the distance YH to the distance $YH_{cg}$ is 0.5 or less.

EXAMPLES

Next, Examples will be described. The embodiments may be modified as long as the effects of the invention are exhibited.

In Examples, a head impact test was simulated by generating a simulation model of the display device 1 and executing a simulation of applying an impact to the reference point H with respect to the simulation model of the display device 1. Hereinafter, the model of each Example will be described. Tables 1 to 3 are tables for describing each Example.

TABLE 1

| | Conditions | | | | |
| | Glass article thickness t (mm) | First chamfered portion width A (mm) | Second chamfered portion width B (mm) | Side surface portion thickness C (mm) | First chamfered portion thickness D (mm) |
|---|---|---|---|---|---|
| Ex. 1 | 1.3 | 0.5 | 0.5 | 0.52 | 0.25 |
| Ex. 2 | 1.3 | 0.5 | 1 | 0.52 | 0.25 |
| Ex. 3 | 1.3 | 0.5 | 1 | 0.52 | 0.25 |
| Ex. 4 | 1.3 | 0.5 | 1.5 | 0.52 | 0.25 |
| Ex. 5 | 1.3 | 0.5 | 2 | 0.52 | 0.25 |
| Ex. 6 | 1.3 | 0.5 | 1 | 0.26 | 0.25 |
| Ex. 7 | 1.3 | 0.5 | 1 | 0.26 | 0.25 |
| Ex. 8 | 1.3 | 0.5 | 1.5 | 0.26 | 0.25 |
| Ex. 9 | 1.3 | 0.5 | 1.5 | 0.26 | 0.25 |
| Ex. 10 | 1.3 | 1 | 1.5 | 0.78 | 0.25 |
| Ex. 11 | 1.3 | 1 | 2 | 0.78 | 0.25 |
| Ex. 12 | 1.3 | 1 | 1.5 | 0.52 | 0.25 |
| Ex. 13 | 1.3 | 1 | 1 | 0.26 | 0.25 |
| Ex. 14 | 1.3 | 1 | 2 | 0.26 | 0.25 |
| Ex. 15 | 1.3 | 1.5 | 2 | 0.78 | 0.25 |
| Ex. 16 | 1.3 | 1.5 | 1.5 | 0.52 | 0.25 |
| Ex. 17 | 1.3 | 1.5 | 0.5 | 0.26 | 0.25 |
| Ex. 18 | 1.3 | 1.5 | 2 | 0.26 | 0.25 |
| Ex. 19 | 1.3 | 2 | 1 | 0.78 | 0.25 |
| Ex. 20 | 1.3 | 2 | 1.5 | 0.78 | 0.25 |
| Ex. 21 | 1.3 | 2 | 1.5 | 0.78 | 0.25 |
| Ex. 22 | 1.3 | 2 | 2 | 0.78 | 0.25 |
| Ex. 23 | 1.3 | 2 | 2 | 0.78 | 0.25 |
| Ex. 24 | 1.3 | 2 | 1 | 0.52 | 0.25 |

TABLE 1-continued

| | | | | | |
|---|---|---|---|---|---|
| Ex. 25 | 1.3 | 2 | 0.25 | 0.26 | 0.25 |
| Ex. 26 | 1.3 | 0.5 | 0.25 | 0.52 | 0.5 |
| Ex. 27 | 1.3 | 1 | 0.5 | 0.52 | 0.5 |
| Ex. 28 | 1.3 | 1.5 | 0.5 | 0.52 | 0.5 |
| Ex. 29 | 1.3 | 1.5 | 2 | 0.52 | 0.5 |
| Ex. 30 | 1.3 | 2 | 0.25 | 0.52 | 0.5 |
| Ex. 31 | 1.3 | 2 | 0.5 | 0.52 | 0.5 |
| Ex. 32 | 1.3 | 2 | 0.5 | 0.52 | 0.5 |

| | Conditions | | | Evaluation |
|---|---|---|---|---|
| | CG Young's modulus (GPa) | Parameter R | Satisfy Formula (2) | Crack determination |
| Ex. 1 | 50 | 17.33 | Yes | A+ |
| Ex. 2 | 74 | 25.44 | No | B− |
| Ex. 3 | 90 | 31.52 | No | B− |
| Ex. 4 | 74 | 24.44 | No | B |
| Ex. 5 | 74 | 23.43 | Yes | A |
| Ex. 6 | 74 | 24.57 | No | B |
| Ex. 7 | 50 | 15.45 | Yes | A+ |
| Ex. 8 | 74 | 23.56 | Yes | A |
| Ex. 9 | 90 | 29.64 | No | B− |
| Ex. 10 | 74 | 24.93 | No | B− |
| Ex. 11 | 74 | 23.92 | No | B |
| Ex. 12 | 74 | 24.05 | No | B |
| Ex. 13 | 74 | 24.18 | No | B |
| Ex. 14 | 74 | 22.17 | Ycs | A+ |
| Ex. 15 | 74 | 23.54 | Yes | A |
| Ex. 16 | 74 | 23.67 | No | B |
| Ex. 17 | 74 | 24.80 | No | B− |
| Ex. 18 | 74 | 21.79 | Yes | A+ |
| Ex. 19 | 74 | 25.16 | No | B− |
| Ex. 20 | 74 | 24.16 | No | B |
| Ex. 21 | 50 | 15.04 | Ycs | A+ |
| Ex. 22 | 74 | 23.16 | Yes | A |
| Ex. 23 | 90 | 29.24 | No | B− |
| Ex. 24 | 74 | 24.29 | No | B |
| Ex. 25 | 74 | 24.92 | No | B− |
| Ex. 26 | 74 | 24.91 | No | B− |
| Ex. 27 | 74 | 24.02 | No | B |
| Ex. 28 | 74 | 23.64 | No | B |
| Ex. 29 | 74 | 20.63 | Yes | A+ |
| Ex. 30 | 50 | 14.63 | Yes | A+ |
| Ex. 31 | 74 | 23.25 | Yes | A |
| Ex. 32 | 90 | 29.33 | No | B− |

TABLE 2

| | Conditions | | | |
|---|---|---|---|---|
| | Glass article thickness t (mm) | First chamfered portion width A (mm) | Second chamfered portion width B (mm) | Side surface portion thickness C (mm) | First chamfered portion thickness D (mm) |
| Ex. 33 | 2 | 0.5 | 2 | 0.78 | 0.25 |
| Ex. 34 | 2 | 0.5 | 0.5 | 0.26 | 0.25 |
| Ex. 35 | 2 | 0.5 | 2 | 0.26 | 0.25 |
| Ex. 36 | 2 | 0.5 | 2 | 0.26 | 0.25 |
| Ex. 37 | 2 | 0.5 | 2 | 0.26 | 0.25 |
| Ex. 38 | 2 | 1 | 0.25 | 0.78 | 0.25 |
| Ex. 39 | 2 | 1 | 2 | 0.52 | 0.25 |
| Ex. 40 | 2 | 1 | 2 | 0.26 | 0.25 |
| Ex. 41 | 2 | 1 | 2 | 0.26 | 0.25 |
| Ex. 42 | 2 | 1 | 2 | 0.26 | 0.25 |
| Ex. 43 | 2 | 1.5 | 0.25 | 0.78 | 0.25 |
| Ex. 44 | 2 | 1.5 | 2 | 0.78 | 0.25 |
| Ex. 45 | 2 | 1.5 | 2 | 0.52 | 0.25 |
| Ex. 46 | 2 | 1.5 | 1.5 | 0.26 | 0.25 |
| Ex. 47 | 2 | 2 | 0.5 | 0.78 | 0.25 |
| Ex. 48 | 2 | 2 | 2 | 0.78 | 0.25 |
| Ex. 49 | 2 | 2 | 1.5 | 0.52 | 0.25 |
| Ex. 50 | 2 | 2 | 1.5 | 0.26 | 0.25 |
| Ex. 51 | 2 | 2 | 1.5 | 0.26 | 0.25 |
| Ex. 52 | 2 | 2 | 1.5 | 0.26 | 0.25 |
| Ex. 53 | 2 | 1 | 0.25 | 0.52 | 0.5 |
| Ex. 54 | 2 | 1 | 1.5 | 0.52 | 0.5 |

TABLE 2-continued

| | | | | | |
|-------|---|-----|-----|------|-----|
| Ex. 55 | 2 | 1 | 1.5 | 0.26 | 0.5 |
| Ex. 56 | 2 | 1.5 | 0.5 | 0.52 | 0.5 |
| Ex. 57 | 2 | 1.5 | 2 | 0.52 | 0.5 |
| Ex. 58 | 2 | 1.5 | 2 | 0.52 | 0.5 |
| Ex. 59 | 2 | 1.5 | 2 | 0.52 | 0.5 |
| Ex. 60 | 2 | 2 | 1 | 0.52 | 0.5 |

| | Conditions | | | Evaluation |
|---|---|---|---|---|
| | CG Young's modulus (GPa) | Parameter R | Satisfy Formula (2) | Crack determination |
| Ex. 33 | 74 | 25.64 | No | B− |
| Ex. 34 | 74 | 26.46 | No | B− |
| Ex. 35 | 74 | 24.50 | No | B |
| Ex. 36 | 90 | 30.58 | No | B− |
| Ex. 37 | 50 | 15.38 | Yes | A+ |
| Ex. 38 | 74 | 27.68 | No | B− |
| Ex. 39 | 74 | 24.82 | No | B− |
| Ex. 40 | 74 | 24.25 | No | B |
| Ex. 41 | 90 | 30.33 | No | B− |
| Ex. 42 | 50 | 15.13 | Yes | A+ |
| Ex. 43 | 74 | 27.43 | No | B− |
| Ex. 44 | 74 | 25.14 | No | B− |
| Ex. 45 | 74 | 24.57 | No | B |
| Ex. 46 | 74 | 24.66 | No | B |
| Ex. 47 | 74 | 26.85 | No | B− |
| Ex. 48 | 74 | 24.89 | No | B− |
| Ex. 49 | 74 | 24.98 | No | B− |
| Ex. 50 | 74 | 24.41 | No | B |
| Ex. 51 | 90 | 30.49 | No | B− |
| Ex. 52 | 50 | 15.29 | Yes | A+ |
| Ex. 53 | 74 | 25.78 | No | B− |
| Ex. 54 | 74 | 24.15 | No | B |
| Ex. 55 | 74 | 23.58 | Yes | A |
| Ex. 56 | 74 | 25.21 | No | B− |
| Ex. 57 | 74 | 23.25 | Yes | A |
| Ex. 58 | 90 | 29.33 | No | B− |
| Ex. 59 | 50 | 14.13 | Yes | A+ |
| Ex. 60 | 74 | 24.30 | No | B |

TABLE 3

| | Conditions | | | | |
|---|---|---|---|---|---|
| | Glass article thickness t (mm) | First chamfered portion width A (mm) | Second chamfered portion width B (mm) | Side surface portion thickness C (mm) | First chamfered portion thickness D (mm) |
| Ex. 61 | 0.7 | 0.5 | 0.25 | 0.3 | 0.1 |
| Ex. 62 | 0.7 | 0.5 | 1 | 0.3 | 0.1 |
| Ex. 63 | 0.7 | 0.5 | 1 | 0.3 | 0.1 |
| Ex. 64 | 0.7 | 0.5 | 1 | 0.3 | 0.1 |
| Ex. 65 | 0.7 | 0.5 | 1.5 | 0.3 | 0.1 |
| Ex. 66 | 0.7 | 0.5 | 2 | 0.1 | 0.1 |
| Ex. 67 | 0.7 | 1.5 | 0.25 | 0.3 | 0.1 |
| Ex. 68 | 0.7 | 1.5 | 2 | 0.3 | 0.1 |
| Ex. 69 | 0.7 | 1.5 | 0.25 | 0.1 | 0.1 |
| Ex. 70 | 0.7 | 1.5 | 0.25 | 0.1 | 0.1 |
| Ex. 71 | 0.7 | 1.5 | 0.25 | 0.1 | 0.1 |
| Ex. 72 | 0.7 | 1.5 | 2 | 0.1 | 0.1 |
| Ex. 73 | 0.7 | 2 | 0.5 | 0.3 | 0.1 |
| Ex. 74 | 0.7 | 2 | 1 | 0.3 | 0.1 |
| Ex. 75 | 0.7 | 2 | 2 | 0.3 | 0.1 |
| Ex. 76 | 0.7 | 0.5 | 0.25 | 0.3 | 0.25 |
| Ex. 77 | 0.7 | 0.5 | 0.25 | 0.1 | 0.25 |
| Ex. 78 | 0.7 | 1.5 | 0.25 | 0.3 | 0.25 |
| Ex. 79 | 0.7 | 1.5 | 0.25 | 0.3 | 0.25 |
| Ex. 80 | 0.7 | 1.5 | 0.25 | 0.3 | 0.25 |
| Ex. 81 | 0.7 | 1.5 | 0.25 | 0.1 | 0.25 |
| Ex. 82 | 0.7 | 2 | 0.5 | 0.3 | 0.25 |
| Ex. 83 | 0.7 | 2 | 1 | 0.3 | 0.25 |

TABLE 3-continued

| | Conditions | | | Evaluation |
| --- | --- | --- | --- | --- |
| | CG Young's modulus (GPa) | Parameter R | Satisfy Formula (2) | Crack determination |
| Ex. 61 | 74 | 26.84 | No | B− |
| Ex. 62 | 74 | 24.04 | No | B |
| Ex. 63 | 90 | 30.12 | No | B− |
| Ex. 64 | 50 | 14.92 | Yes | A+ |
| Ex. 65 | 74 | 22.18 | Yes | A+ |
| Ex. 66 | 74 | 19.06 | Yes | A+ |
| Ex. 67 | 74 | 25.41 | No | B− |
| Ex. 68 | 74 | 18.88 | Yes | A+ |
| Ex. 69 | 74 | 24.16 | No | B |
| Ex. 70 | 90 | 30.24 | No | B− |
| Ex. 71 | 50 | 15.04 | Yes | A+ |
| Ex. 72 | 74 | 17.63 | Yes | A+ |
| Ex. 73 | 74 | 23.76 | No | B |
| Ex. 74 | 74 | 21.90 | Ycs | A+ |
| Ex. 75 | 74 | 18.17 | Yes | A+ |
| Ex. 76 | 74 | 24.57 | No | B |
| Ex. 77 | 74 | 23.31 | Yes | A |
| Ex. 78 | 74 | 23.14 | Yes | A |
| Ex. 79 | 90 | 29.22 | No | B− |
| Ex. 80 | 50 | 14.02 | Yes | A+ |
| Ex. 81 | 74 | 21.89 | Ycs | A+ |
| Ex. 82 | 74 | 21.49 | Yes | A+ |
| Ex. 83 | 74 | 19.63 | Yes | A+ |

Example 1

Figure 11:
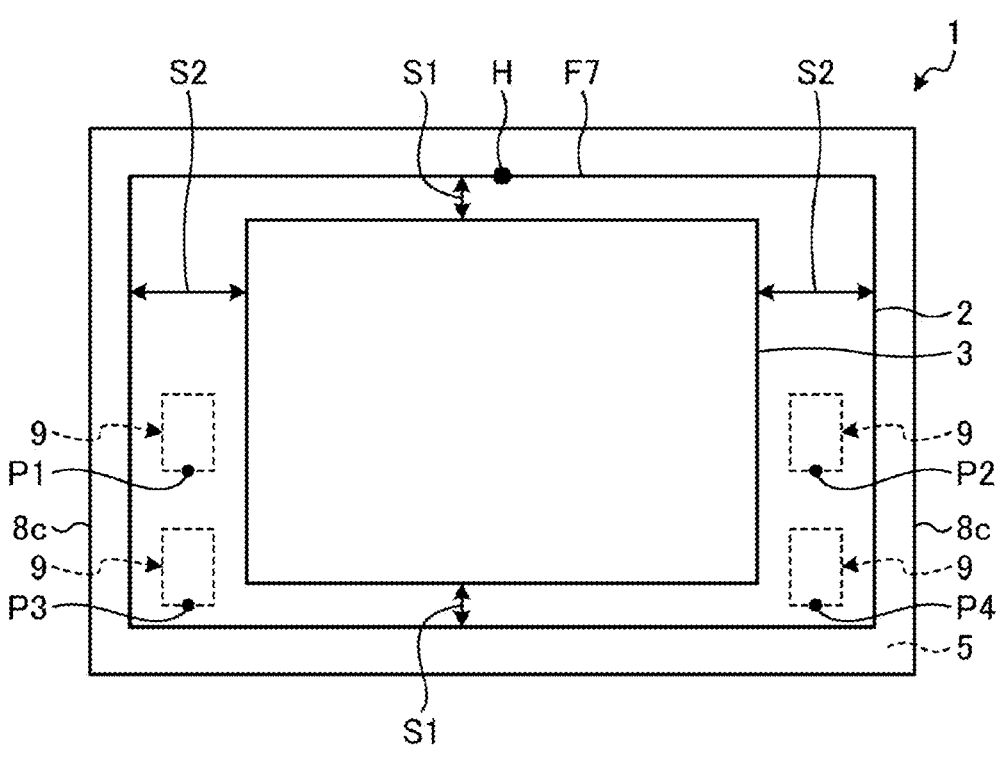
FIG. 11 is a schematic front view of a display device according to Examples.

FIG. 11 is a schematic front view of a display device according to Examples. In Example 1, a simulation model of a display device 1 as illustrated in FIG. 11 was prepared. As illustrated in FIG. 11, the model of the display device 1 included the glass article 2, the display panel 3, the sidewall member 8c having ribs on the direction Z2 side, and the bottom member 5. That is, the model of the display device 1 employed the structure described in FIGS. 9 and 10.

In the model of the display device 1 of Example 1, the size of the glass article 2 was set to 250 mm in the X direction and 150 mm in the Y direction, and the Young's modulus $E_{cg}$ was set to 74 GPa. The width A of the first chamfered portion 2CA, the width B of the second chamfered portion 2CB, the thickness C of the side surface portion 2CC, the thickness D of the first chamfered portion 2CA, and the thickness t of the glass article 2 in the Z direction were set to the values shown in Tables 1 to 3.

In the model of the display device 1, the size of the display panel 3 was set to 170 mm in the X direction and 125 mm in the Y direction, and the thickness in the Z direction was set to 1.1 mm.

The distance S1 between the end portion of the glass article 2 in the Y direction and the end portion of the display panel 3 in the Y direction was set to 12 mm, and the distance S2 between the end portion of the glass article 2 in the X direction and the end portion of the display panel 3 in the X direction was set to 40 mm.

In the model of the display device 1, the size of the bottom member 5 was the same as that of the glass article 2 in the X direction and the Y direction, and the thickness of the plate portion 6 was set to 2 mm. The Young's modulus Ep of the bottom member 5 was set to 70 GPa.

The thickness of the base portion 8c1 of the sidewall member 8c in the Z direction was set to 1.5 mm, and a half value (L/2) of the distance L between the ribs 8c2 closest to the reference point H was set to 13 mm. The Young's modulus of the sidewall member 8c was set to 2.2 GPa.

In the model of the display device 1, the brackets 9 were disposed on a surface of the bottom member 5 on the direction Z1 side with the fixing points P set such that the ratio $YH/YH_{cg}$ was 0.5. The position of each fixing point in the X direction was a center position between an end portion of the glass article 2 in the X direction and an end portion of the display panel 3 in the X direction.

The reference point H was set at a position on the point F7 of the glass article 2 on the direction Y1 side where the distances from the fixing points P1 and P2 were equal.

As shown in Tables 1 to 3, the parameter R was calculated by using Formula (1). The case where the parameter R satisfies Formula (2) was determined as Yes, and the case where the parameter R does not satisfy Formula (2) was determined as No.

Examples 2 to 83

In Examples 2 to 83, the model was generated by changing at least one of the width A of the first chamfered portion 2CA, the width B of the second chamfered portion 2CB, the thickness C of the side surface portion 2CC, the thickness D of the first chamfered portion 2CA, the thickness t of the glass article 2 in the Z direction, and the Young's modulus $E_{cg}$ of the glass article 2, as shown in Tables 1 to 3, compared to Example 1.

Evaluation

A simulation was executed in which an impactor was caused to collide with the reference point H of the model generated in each Example under the following conditions.
   Collision energy of impactor: 152 (J)
   Impactor weight: 6.8 (kg)
   Impactor diameter: 165 (mm)
   Impactor collision angle (inclination angle of collision direction of impactor with respect to Z direction): 30°

Evaluation Results

Analysis results of the stress generated in the glass article 2 when the impactor collides with the reference point H were acquired by the simulation. The case where the maximum stress generated in the glass article 2 was equal to or less than a threshold at which cracks occur and was 5.1% or more lower than the threshold was evaluated as A+. The case where the maximum stress is 0% to 5.0% lower than the threshold at which cracks occur was evaluated as A. The case where the maximum stress was greater than the threshold at which cracks occur and was 0%< to 5.0% greater than the threshold was evaluated as B. The case where the maximum stress was 5.1% or more greater than the threshold at which cracks occur was evaluated as B−. The cases A+ and A were evaluated as pass, and the cases B and B− were evaluated as fail.

When the glass article 2 has the same configuration, there may be a case where the glass article 2 is broken and a case where the glass article 2 is not broken even with the same generated stress due to a strength variation. As a value of the generated stress is closer to the threshold at which cracks occur, a crack occurrence frequency increases.

In the cases of A+ and A, the generated maximum stress is equal to or less than the threshold, and cracks of the cover glass are unlikely to occur in the head impact test. In the cases of B and B, the generated maximum stress is greater than the threshold, and cracks of the cover glass are more likely to occur in the head impact test. Further, in the case of A+, the crack occurrence frequency can be significantly reduced.

As shown in Tables 1 to 3, in Examples 1, 5, 7, 8, 14, 15, 18, 21, 22, 29, 30, 31, 37, 42, 52, 55, 57, 59, 64 to 66, 68, 71, 72, 74, 75, 77, 78, and 80 to 83 which are Inventive Examples in which the parameter R satisfies Formula (2), it can be seen that the evaluation is pass and cracks of the glass article 2 can be reduced. On the other hand, in the other examples as Comparative Examples, it can be seen that the evaluation is fail and cracks of the glass article 2 cannot be reduced. In addition, for example, as shown in Examples 82 and 83 and the like, the larger the width B of the second chamfered portion 2CB, the higher the evaluation result, and therefore it can be seen that it is preferable to increase the width B of the second chamfered portion 2CB.

Although the embodiments of the present invention have been described above, the embodiments are not limited to the contents of these embodiments. In addition, the components described above should include those that can be easily conceived by a person skilled in the art, those that are substantially the same, and those within a so-called equivalent range. Further, the above components can be appropriately combined. Further, various omissions, substitutions, or modifications of the components can be made without departing from the gist of the embodiments described above.

The present application is based on a Japanese Patent Application (Japanese Patent Application No. 2022-080347) filed on May 16, 2022, the contents of which are incorporated herein by reference.

REFERENCE SIGNS LIST

1 display device
2 glass article
2A first main surface
2B second main surface
2C end surface
2CA first chamfered portion
2CB second chamfered portion
2CC side surface portion
3 display panel
4 backlight unit

5 bottom member
6 plate portion
7 rib
8 sidewall member
9 bracket
10 interior portion

The invention claimed is:

1. A glass article, comprising:
a first main surface;
a second main surface; and
an end surface connecting the first main surface and the second main surface, wherein
the end surface includes:
    a side surface portion,
    a first chamfered portion connecting the side surface portion and the first main surface, and
    a second chamfered portion connecting the side surface portion and the second main surface, and
a parameter R defined by Formula (1) satisfies Formula (2):

$$R = 0.38 \cdot E_{cg} - A/t - 2.61 \cdot B/t + 4.38 \cdot C/t - 10.6 \cdot D/t \qquad (1)$$

$$R \leq 23.58 \qquad (2)$$

in Formula (1),
    $E_{cg}$ is a Young's modulus (GPa) of the glass article,
    A is a width (mm) of the first chamfered portion,
    B is a width (mm) of the second chamfered portion,
    C is a thickness (mm) of the side surface portion,
    D is a thickness (mm) of the first chamfered portion, and
    t is a thickness (mm) of the glass article.
2. The glass article according to claim 1, wherein
the width A of the first chamfered portion is greater than 0 mm and 2 mm or less,
the width B of the second chamfered portion is greater than 0 mm and 2 mm or less,
the thickness C of the side surface portion is greater than 0 mm and 2 mm or less, and
the thickness D of the first chamfered portion is greater than 0 mm and 2 mm or less.
3. The glass article according to claim 1, wherein
the glass article:
    comprises a strengthened glass having a compressive stress layer with a thickness of 10 μm or more,
    has a thickness of 0.5 mm or more and 2.5 mm or less, and
    has a Young's modulus of 60 GPa or more and 90 GPa or less.
4. The glass article according to claim 1, wherein
the width B of the second chamfered portion is 1.0 mm or more.
5. The glass article according to claim 1, wherein
the thickness C of the side surface portion is 0.25 mm or more.
6. The glass article according to claim 1, wherein
the thickness D of the first chamfered portion is 0.1 mm or more and 0.7 times or less with respect to the thickness t of the glass article.
7. The glass article according to claim 1, wherein
the end surface has an asymmetric shape, and
values of the thickness D of the first chamfered portion and a thickness of the second chamfered portion (t−(C+D)) are different, or values of the width A of the first chamfered portion and the width B of the second chamfered portion are different.

8. The glass article according to claim 1, wherein
the width A of the first chamfered portion is 2 mm or less,
a glass article thickness ratio (A/t) which is a ratio of the width A of the first chamfered portion to the thickness of the glass article is 0.77 or more,
the width B of the second chamfered portion is 1.0 mm or more and 2 mm or less,
the thickness C of the side surface portion is 0.2 mm or more,
a glass article thickness ratio (C/t) which is a ratio of the thickness C of the side surface portion to the thickness of the glass article is 0.6 or less, and
a glass article thickness ratio (D/t) which is a ratio of the thickness D of the first chamfered portion to the thickness of the glass article is 0.1 or more and 0.7 or less.

9. The glass article according to claim 1, wherein
the Young's modulus is 60 GPa or more and 80 GPa or less,
the thickness C of the side surface portion is 0.2 mm or more,
the thickness D of the first chamfered portion has a glass article thickness ratio (D/t) of greater than 0.25, and
the width A of the first chamfered portion has a glass article thickness ratio (A/t) of greater than 1.0.

10. The glass article according to claim 1, wherein
the Young's modulus is 60 GPa or more and 80 GPa or less,
the thickness C of the side surface portion is 0.2 mm or more,
the thickness D of the first chamfered portion has a glass article thickness ratio (D/t) of 0.25 or less,
the width A of the first chamfered portion has a glass article thickness ratio (A/t) of 2.0 or less, and
the width B of the second chamfered portion has a glass article thickness ratio (B/t) of 1.10 or more.

11. The glass article according to claim 1, wherein
the Young's modulus is 60 GPa or more and 80 GPa or less,
the thickness C of the side surface portion is 0.2 mm or more, and
the width A of the first chamfered portion has a glass article thickness ratio (A/t) of greater than 1.5.

12. The glass article according to claim 1, wherein
the Young's modulus is 60 GPa or more and 80 GPa or less,
the thickness C of the side surface portion is 0.2 mm or more,
the width A of the first chamfered portion has a glass article thickness ratio (A/t) of 0.3 or more and 1.5 or less,
the width B of the second chamfered portion has a glass article thickness ratio (B/t) of 0.7 or more, and
the thickness D of the first chamfered portion has a glass article thickness ratio (D/t) of 0.14 or more.

13. The glass article according to claim 1, wherein
the Young's modulus is 60 GPa or more and 80 GPa or less,
the thickness C of the side surface portion is 0.2 mm or more, and
the width A of the first chamfered portion has a glass article thickness ratio (A/t) of greater than 1.5.

14. The glass article according to claim 1, wherein
the Young's modulus is 60 GPa or more and 80 GPa or less,
the thickness C of the side surface portion is 0.2 mm or more, and
the width B of the second chamfered portion has a glass article thickness ratio (B/t) of greater than 1.5.

15. The glass article according to claim 1, wherein
the thickness C of the side surface portion is less than 0.2 mm.

16. The glass article according to claim 1, wherein
the glass article is used as a cover member of an in-vehicle display device.

17. The glass article according to claim 8, wherein
a printed layer is provided on the second main surface.

18. An in-vehicle display device, comprising:
the glass article according to claim 1,
a display panel, and
a bottom member configured to be fixed to a vehicle, in a stacked manner, wherein
the second main surface of the glass article is positioned to face the display panel.

19. The display device according to claim 18, wherein
the glass article has a Young's modulus of 60 GPa or more and 90 GPa or less,
the display panel has a Young's modulus of 20 GPa or more and 90 GPa or less, and
the bottom member has a Young's modulus of 40 GPa or more and 250 GPa or less.

20. The display device according to claim 18, wherein
when a direction from the glass article toward the bottom member in a thickness direction of the glass article is defined as a first direction,
the bottom member has a plate portion and a rib protruding from a main surface of the plate portion on the first direction side, and
at least two fixing points to be fixed to the vehicle are formed on the main surface on the first direction side, and
when a virtual plane passing through an intermediate point of two of the fixing points and perpendicular to a line connecting the two fixing points is defined as a virtual plane T, a length of an intersection line between a main surface of the glass article and the virtual plane T is defined as a distance $YH_{cg}$, and a length of an intersection line between a main surface of the display panel and the virtual plane T from an upper end to a point corresponding to the intermediate point is defined as a distance YH,
a ratio $YH/YH_{cg}$ of the distance YH to the distance $YH_{cg}$ is 0.5 or less.

* * * * *